(12) United States Patent
Guo et al.

(10) Patent No.: US 9,515,152 B2
(45) Date of Patent: Dec. 6, 2016

(54) SIMPLE AND COST-FREE MTP STRUCTURE

(71) Applicant: GLOBALFOUNDRIES Singapore Pte. Ltd., Singapore (SG)

(72) Inventors: Pengfei Guo, Singapore (SG); Shyue Seng Tan, Singapore (SG); Guowei Zhang, Singapore (SG); Francis Poh, Singapore (SG); Danny Pak-Chum Shum, Poughkeepsie, NY (US)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/684,311

(22) Filed: Apr. 10, 2015

(65) Prior Publication Data

US 2015/0214316 A1 Jul. 30, 2015

Related U.S. Application Data

(63) Continuation-in-part of application No. 14/253,878, filed on Apr. 16, 2014, now Pat. No. 9,362,374.

(Continued)

(51) Int. Cl.
*H01L 29/423* (2006.01)
*H01L 29/66* (2006.01)
(Continued)

(52) U.S. Cl.
CPC ..... *H01L 29/42328* (2013.01); *G11C 16/0433* (2013.01); *H01L 27/11558* (2013.01); *H01L 29/42324* (2013.01); *H01L 29/66575* (2013.01); *H01L 29/66825* (2013.01); *H01L 29/7835* (2013.01); *H01L 29/7881* (2013.01); *H01L 29/7883* (2013.01); *H01L 29/7885* (2013.01)

(58) Field of Classification Search
CPC .............. H01L 29/42328; H01L 29/66825; H01L 29/7835; H01L 29/66575; H01L 29/43324; H01L 29/7881; H01L 29/7883; H01L 29/7885; H01L 27/11558; G11C 16/0433

See application file for complete search history.

(56) References Cited

U.S. PATENT DOCUMENTS 5,841,165 A 11/1998 Chang et al.
6,044,018 A 3/2000 Sung et al.
(Continued)

FOREIGN PATENT DOCUMENTS

KR 100667215 B1 1/2007

OTHER PUBLICATIONS

L. Chang et al., Non-volatile memory device with true CMOS compatibility, Electronics Letters, Aug. 19, 1999, vol. 35, No. 17.
(Continued)

*Primary Examiner* — Long Pham
(74) *Attorney, Agent, or Firm* — Horizon IP Pte. Ltd.

(57) ABSTRACT

Embodiments of a simple and cost-free multi-time programmable (MTP) structure for non-volatile memory cells are presented. The memory cell includes a substrate. A floating gate is disposed over a transistor well. A control gate disposed over a control well is coupled to the floating gate. The control gate includes a control capacitor. A non-self-aligned source/drain (S/D) region is disposed within the transistor well and serves as an erase terminal.

20 Claims, 20 Drawing Sheets

Related U.S. Application Data

(60) Provisional application No. 61/839,879, filed on Jun. 27, 2013.

(51) Int. Cl.
  *H01L 29/78* (2006.01)
  *H01L 29/788* (2006.01)
  *H01L 27/115* (2006.01)
  *G11C 16/04* (2006.01)

(56) References Cited

U.S. PATENT DOCUMENTS

| | | | |
|---|---|---|---|
| 6,124,616 A | 9/2000 | Dennison et al. | |
| 6,130,840 A | 10/2000 | Bergemont et al. | |
| 6,166,954 A | 12/2000 | Chern | |
| 6,211,548 B1 * | 4/2001 | Ma | G11C 16/0408 257/321 |
| 6,452,835 B1 | 9/2002 | Diorio et al. | |
| 6,711,064 B2 | 3/2004 | Yang et al. | |
| 6,727,149 B1 | 4/2004 | Krishnan et al. | |
| 6,740,556 B1 | 5/2004 | Hsu et al. | |
| 6,812,083 B2 | 11/2004 | Shen et al. | |
| 6,819,594 B2 | 11/2004 | Lee et al. | |
| 6,914,825 B2 | 7/2005 | Hsu et al. | |
| 6,920,067 B2 | 7/2005 | Hsu et al. | |
| 7,209,392 B2 | 4/2007 | Chen et al. | |
| 7,391,647 B2 | 6/2008 | Fang et al. | |
| 7,417,897 B2 | 8/2008 | Chen et al. | |
| 7,423,903 B2 | 9/2008 | Lin et al. | |
| 7,474,568 B2 | 1/2009 | Horch | |
| 7,508,719 B2 | 3/2009 | Horch | |
| 8,218,369 B2 | 7/2012 | Lin et al. | |
| 8,305,808 B2 | 11/2012 | Lin et al. | |
| 8,320,180 B2 | 11/2012 | Kalnitsky | |
| 8,355,282 B2 | 1/2013 | Ching et al. | |
| 8,384,155 B2 | 2/2013 | Lin et al. | |
| 2007/0241392 A1 | 10/2007 | Lin et al. | |
| 2008/0035973 A1 | 2/2008 | Lin et al. | |
| 2009/0212342 A1 | 8/2009 | Roizin et al. | |
| 2009/0267127 A1 * | 10/2009 | Chen | G11C 16/10 257/314 |
| 2010/0238738 A1 | 9/2010 | Yoo et al. | |
| 2011/0233643 A1 | 9/2011 | Chang | |
| 2012/0236635 A1 | 9/2012 | Ching et al. | |
| 2012/0236646 A1 | 9/2012 | Hsu et al. | |
| 2013/0020626 A1 | 1/2013 | Tan et al. | |
| 2013/0093012 A1 | 4/2013 | Zhang et al. | |
| 2014/0015047 A1 * | 1/2014 | Ng | H01L 21/82385 257/334 |
| 2015/0036437 A1 | 2/2015 | Li et al. | |

OTHER PUBLICATIONS

Yanjun Ma et al., Reliability of pFET EEPROM With 70-ÅTunnel Oxide Manufactured in Generic Logic CMOS Processes, IEEE Transactions on Device and Materials Reliability, Sep. 2004, vol. 4, No. 3.

Albert Bergemont, Current limitations of floating gate NVM and new alternatives, Maxim Integrated Products, Apr. 10, 2007, EDS Meeting.

* cited by examiner

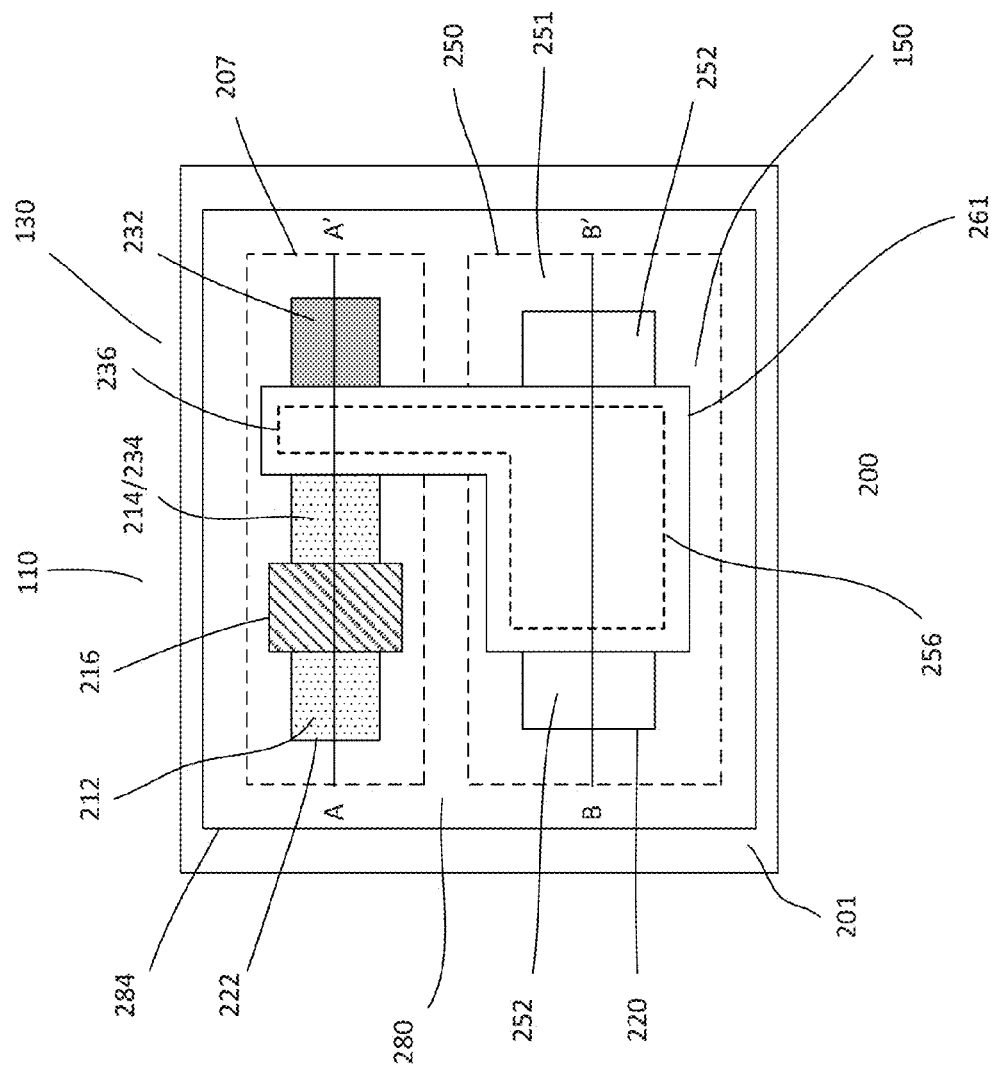

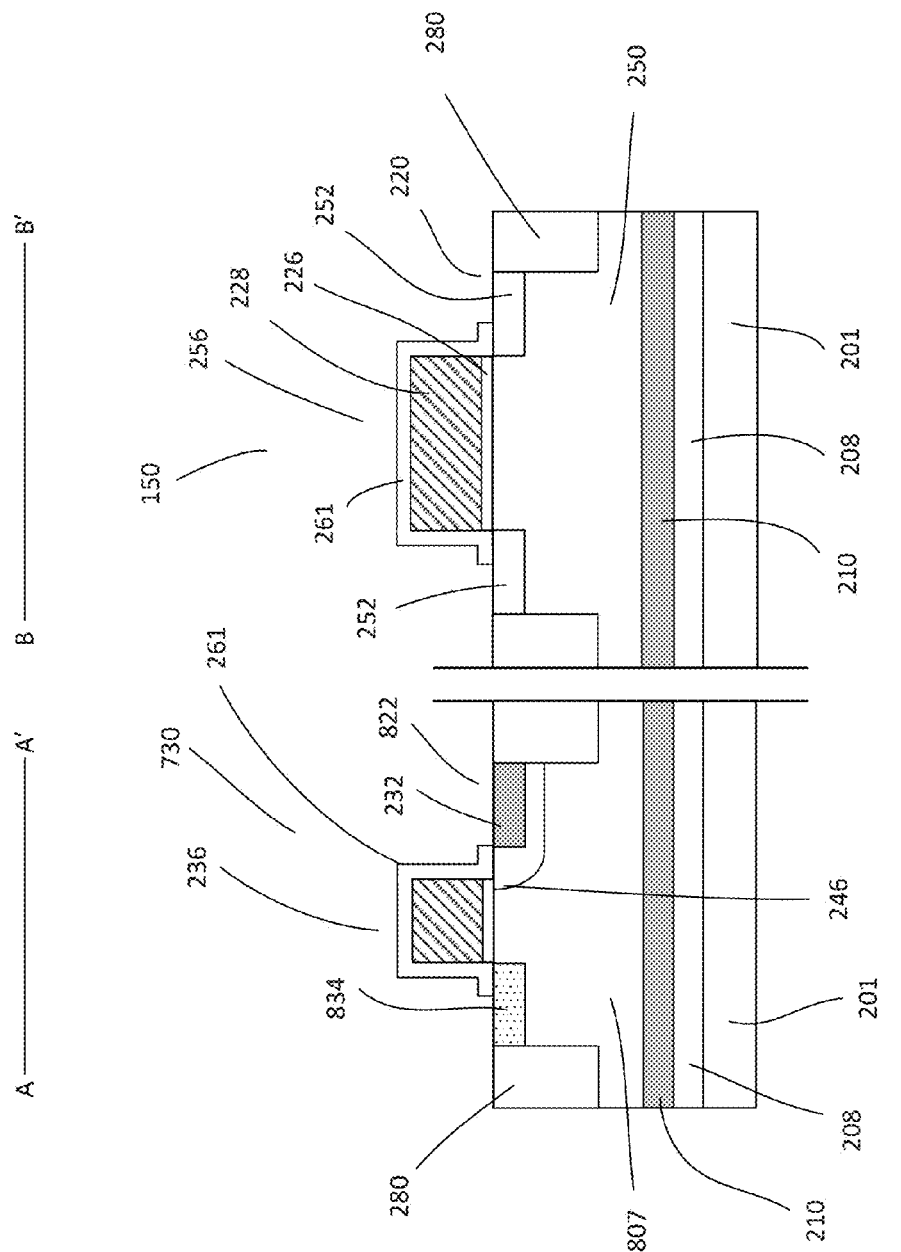

SIMPLE AND COST-FREE MTP STRUCTURE

CROSS-REFERENCE TO RELATED APPLICATIONS

This application is a continuation-in-part application of co-pending U.S. patent application Ser. No. 14/253,878, filed on Apr. 16, 2014, which claims the priority benefit of U.S. Provisional Application Ser. No. 61/839,879, filed on Jun. 27, 2013. In addition, this application is concurrently filed with and cross-references to U.S. patent application Ser. No. 14/684,298 entitled "SIMPLE AND COST-FREE MTP STRUCTURE", and U.S. patent application Ser. No. 14/684,305 entitled "SIMPLE AND COST-FREE MTP STRUCTURE". All disclosures are incorporated herewith by reference in their entireties for all purposes.

BACKGROUND

Multi-time programmable (MTP) memories have been recently introduced for beneficial use in a number of applications where customization is required for both digital and analog designs. These applications include data encryption, reference trimming, manufacturing identification (ID), security ID, and many other applications. Incorporating MTP memories nonetheless also typically comes at the expense of some additional processing steps. Some of the existing approaches to constructing MTP memories tend to suffer from slow access time, smaller coupling ratio and/or large cell size. Some of the existing approaches utilize band-to-band tunneling hot hole (BBHH) for erasing operation, but require high junction voltage and more process steps. Other existing approaches need additional coupling erase gate and coupling capacitor, and hence require more area.

Therefore, there is a need to provide a simple and cost-free MTP structure to create non-volatile memory cells with faster access time, higher coupling ratio and smaller cell size.

SUMMARY

Embodiments generally relate to a simple and cost-free MTP structure. In one embodiment, a non-volatile MTP memory cell includes a substrate. A floating gate is disposed over a transistor well. A control gate disposed over a control well is coupled to the floating gate. The control gate includes a control capacitor. A non-self-aligned source/drain (S/D) region is disposed within the transistor well and serves as an erase terminal.

In another embodiment, a non-volatile MTP memory cell is disclosed. The memory cell includes a substrate prepared with an isolation well. A high voltage (HV) well region is disposed within the isolation well. First and second wells are further disposed within the HV well region. A floating gate is disposed over the second well while a control gate is disposed over the first well. The control gate is coupled to the floating gate. The control gate includes a control capacitor. A non-self-aligned source/drain (S/D) region is disposed within the second well and includes a S/D extension region. The non-self-aligned S/D region serves as an erase terminal.

In yet another embodiment, a method for forming a non-volatile MTP memory cell is disclosed. A substrate is provided and first and second isolation wells are formed in the substrate. First and second wells are formed within the second isolation well. A floating gate is formed over the second well and a control gate is formed over the first well. The control gate is coupled to the first and second wells and includes a capacitor. A non-self-aligned source/drain (S/D) region is formed within the second well. The non-self-aligned S/D region serves as an erase terminal.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of various embodiments. In the following description, various embodiments of the present disclosure are described with reference to the following, in which:

FIG. 2a shows a top view of various embodiments of a memory device and FIGS. 2b-2d show cross-sectional views of various embodiments of a memory device;

FIG. 8a shows a top view of various embodiments of a memory device and FIGS. 8b-8d show cross-sectional views of various embodiments of a memory device;

DETAILED DESCRIPTION

Embodiments generally relate to semiconductor devices. More particularly, some embodiments relate to memory devices, such as non-volatile memory (NVM) devices. Such memory devices, for example, can be incorporated into standalone memory devices, such as USB or other types of portable storage units, or ICs, such as microcontrollers or system on chips (SoCs). The devices or ICs can be incorporated into or used with, for example, consumer electronic products, or relate to other types of devices.

Figure 1:
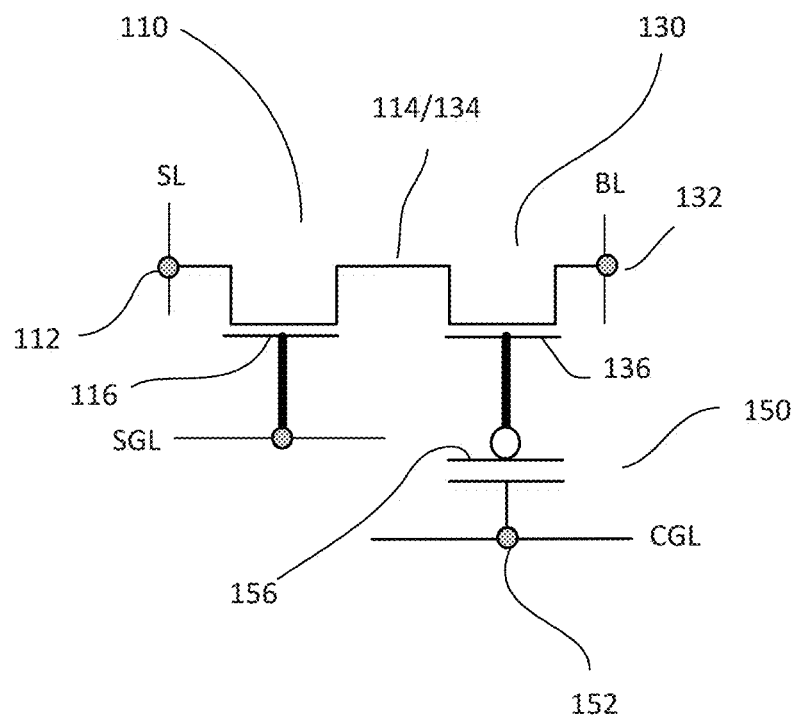
FIG. 1 shows a schematic diagram of an embodiment of a memory cell.

FIG. 1 shows a schematic diagram of an embodiment of a memory cell 100. The memory cell, in one embodiment, is a non-volatile (NV) multi-time programmable (MTP) memory cell 100. As shown, the memory cell 100 includes a first transistor 110, a second transistor 130 and a control capacitor 150. In one embodiment, the second transistor functions as a storage element and the control capacitor functions as a voltage coupling element. The first and second transistors are, for example, metal oxide semiconductor (MOS) transistors. A transistor includes a gate between first and second diffusion regions. The diffusion regions of a transistor are heavily doped regions with first polarity type dopants. The polarity type determines the type of transistor. For example, the first polarity may be n-type for a n-type transistor or p-type for a p-type transistor.

The diffusion regions of the first and second transistors serve as transistor source/drain (S/D) regions. In one embodiment, the transistor S/D regions include self-aligned and non-self-aligned S/D regions. In one embodiment, a self-aligned S/D region is aligned to the transistor gate while a non-self-aligned S/D region is displaced from the transistor gate. For example, the S/D regions may be aligned or displaced from the transistor gate sidewall spacers. Other configurations of S/D region may also be useful.

The transistor S/D regions, in one embodiment, include S/D extension regions. The S/D extension regions include, for example, halo and lightly doped drain (LDD) regions. The halo region is a lightly doped region with second polarity type dopants. As for the LDD region, it is a lightly doped region with first polarity type dopants. For example, the halo region includes p-type dopants for a n-type transistor while the LDD region includes n-type dopants for a n-type transistor. The dopant concentrations of the halo and LDD regions are lower than the S/D region. In general, the dopant concentration of the LDD is heavier or higher than the halo region. For example, the dopant concentration of the halo region is about 1E12 cm$^3$ and the dopant concentration of the LDD region is about 1E13 cm$^{-3}$. Providing other dopant concentrations for the LDD and halo regions may also be useful. For example, the dopant concentrations may be varied depending on the technology node. Other configurations of S/D extension regions may also be useful. For example, providing only a LDD region without halo region may also be useful. A S/D extension region without halo region may, for example, include a deeply doped LDD region.

A gate includes a gate electrode and a gate dielectric. The first transistor 110 serves as an access transistor while the second transistor 130 serves as a storage transistor. For example, the access transistor 110 includes a first access S/D region 112, a second access S/D region 114 and an access gate 116; the storage transistor 130 includes a first storage S/D region 132, a second storage S/D region 134 and a storage gate 136. The access gate 116 may be referred to as a select gate and the storage gate 136 may be referred to as a floating gate. In one embodiment, the first and second access S/D regions 112 and 114 are self-aligned to the access gate 116. In one embodiment, the second storage S/D region 134 is self-aligned to the storage gate while the first storage S/D region 132 is displaced from the storage gate. For example, the first storage S/D region is a non-self-aligned S/D region.

In one embodiment, the control capacitor is a MOS capacitor. The control capacitor 150 includes a control gate 156 with a control gate electrode and a control gate dielectric. The control gate 156 forms the control capacitor 150. The control capacitor includes first and second capacitor plates separated by a dielectric layer. The control gate electrode, for example, serves as the first (or gate) capacitor plate while a control well, which will be described later, serves as the second (or well) capacitor plate. For example, a dielectric layer disposed over the second capacitor plate separates the first and second capacitor plates. At least one control contact region 152 is disposed adjacent to the control gate. The control contact region is a heavily doped region.

For example, the contact region is heavily doped with control or capacitor type dopants to minimize contact resistance. The control contact region 152 serves as a contact region to the control well. In one embodiment, the control gate is coupled to the storage gate. For example, the gates are formed from a common gate conductor.

The access and storage transistors 110 and 130 are coupled in series. For example, the second access S/D region and second storage S/D region 114 and 134 form a common S/D region of the transistors. As for the control gate 156 and storage gate 136, they are commonly coupled. For example, the control capacitor isolates the storage gate, making it a floating gate. Other configurations of the storage and control gates may also be useful. In one embodiment, a common gate conductor couples the control and storage gates. For example, the same gate layers (i.e. gate dielectric and gate electrode layers) form the control gate 156 and storage gate 136. In one embodiment, the same gate dielectric layer used for the storage and control gates includes a thickness suitable for medium voltage (MV) devices. Other suitable dielectric thickness dimensions may also be useful.

The first access S/D region 112 of first or access transistor 110 is coupled to a source line (SL) of the memory device. The first storage S/D region 132 of second or storage transistor 130 is coupled to a bit line (BL) of the memory device. The first access S/D region may serve as a source terminal and the first storage S/D region may serve as a drain terminal of the memory device. The access gate 116 of the first transistor 110, or the select gate of the memory cell 100, is coupled to a select gate line (SGL) of the memory device. The control contact region 152 is coupled to a control gate line (CGL) of the memory device. In one embodiment, the SGL is disposed along a first direction, such as a wordline direction, while the BL is disposed along a second direction, such as the bitline direction. The first and second directions, for example, are orthogonal to each other. As for the CGL, it is disposed along the wordline direction and the SL is disposed along the bitline direction. Other configurations of BL, CGL, SGL and SL may also be useful. For example, the memory cells of a memory array may be commonly coupled to a common SL (CSL) disposed in the wordline direction.

Figure 2B:
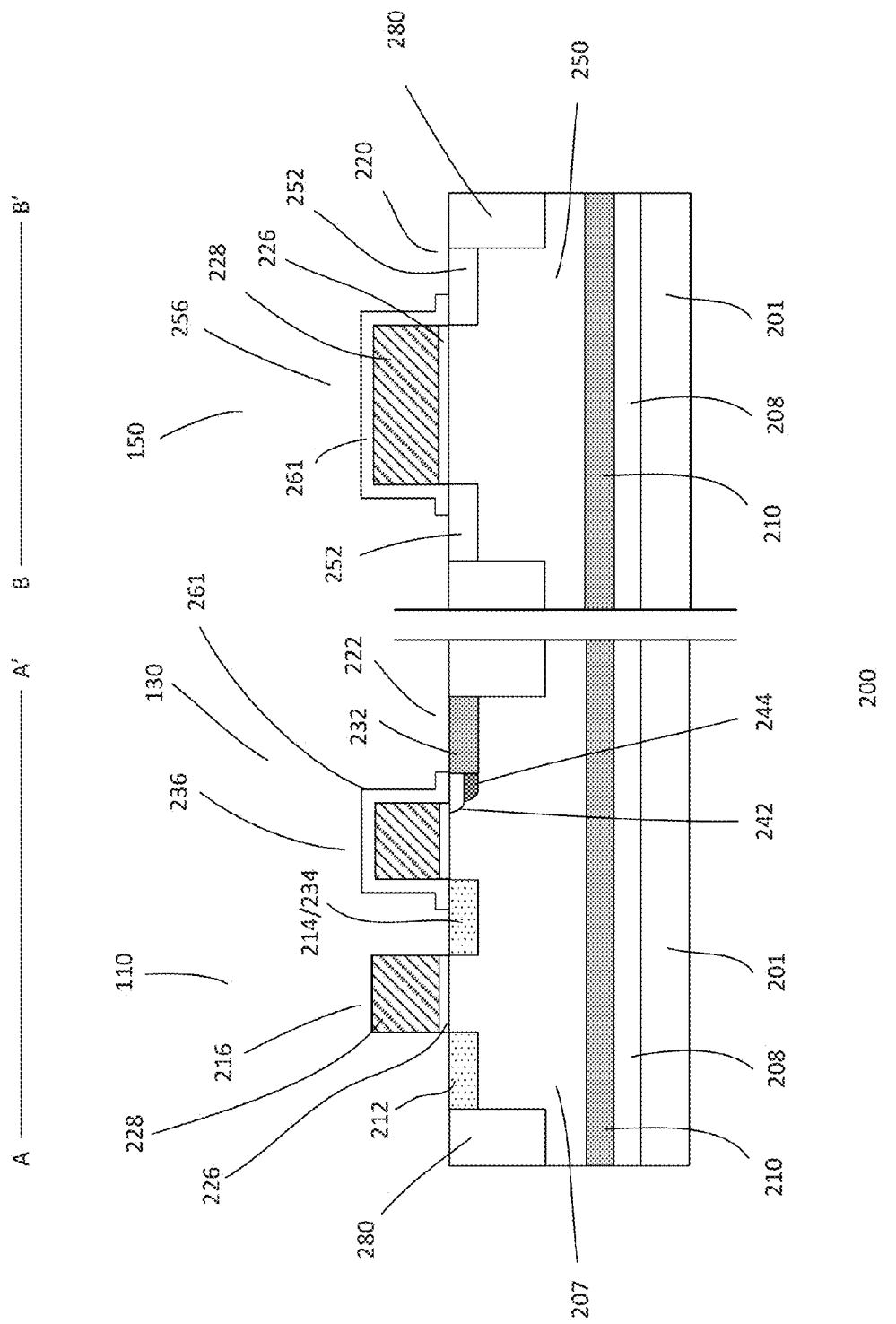
Figure 2C:
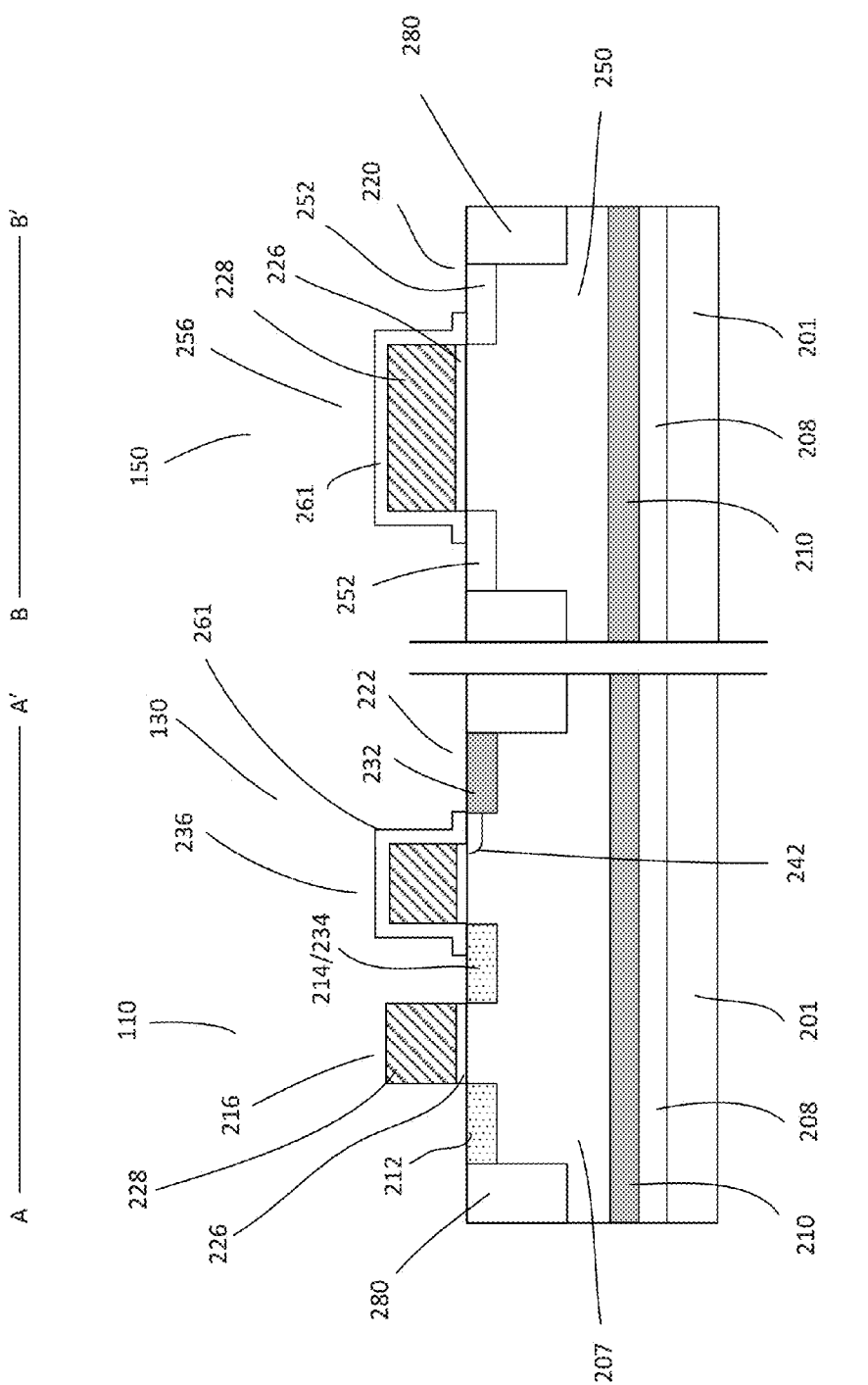
Figure 2D:
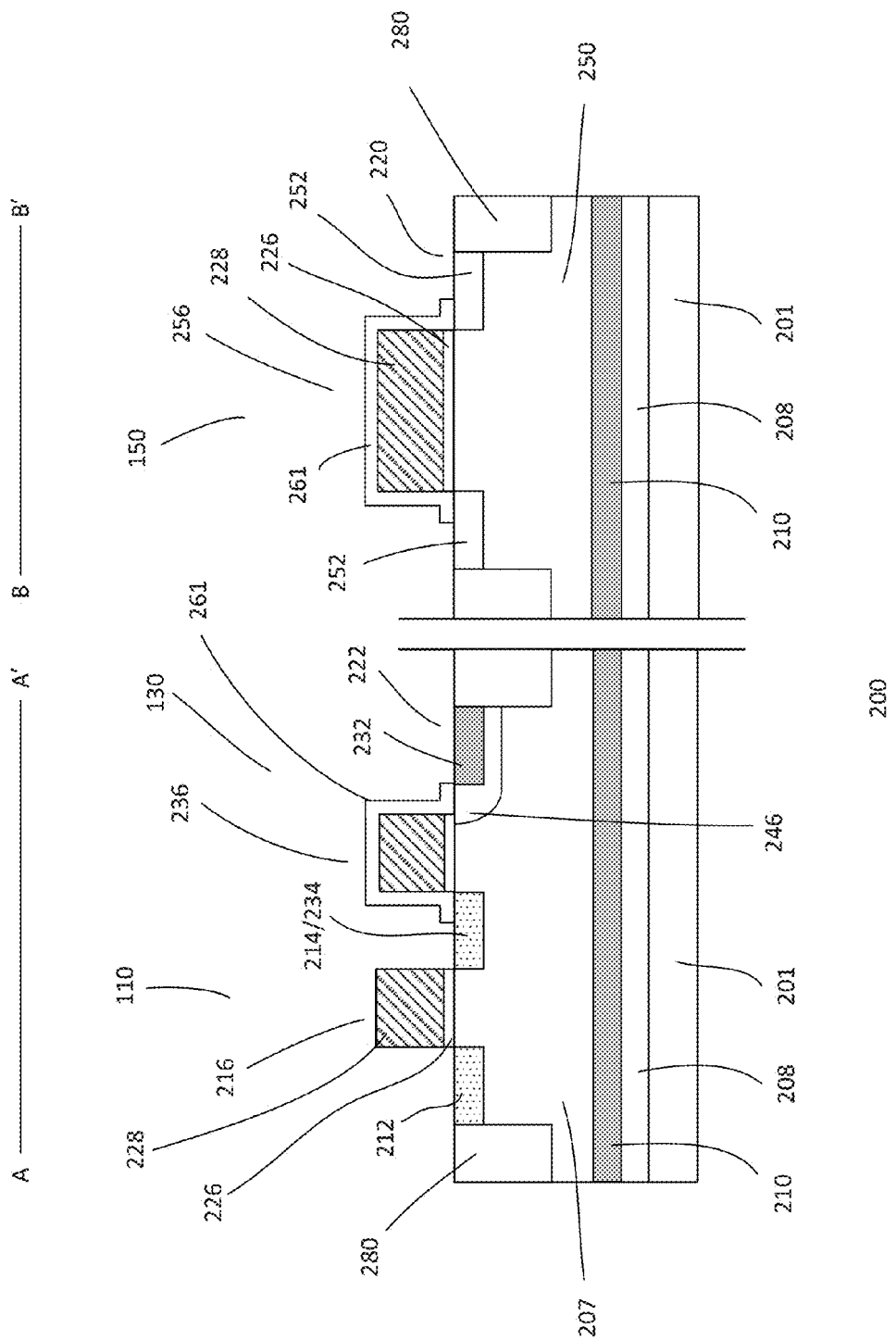

FIG. 2a shows a top view of various embodiments of a memory device and FIGS. 2b-2d show cross-sectional views of various embodiments of the memory device. The memory device includes a memory cell 200. The cross-sectional views are, for example, along A-A' and B-B' of the memory cell 200. The memory cell is similar to that described in FIG. 1. Common elements may not be described or described in detail. The memory cell 200 shown is a non-volatile memory (NVM) cell. For example, the memory cell is a non-volatile MTP memory cell.

The device may include doped regions having different dopant concentrations. For example, the device may include heavily doped (x$^+$), intermediately doped (x) and lightly doped (x$^-$) regions, where x is the polarity type which can be p-type or n-type dopants. A lightly doped region may have a dopant concentration of about 1E11-1E12 cm$^{-3}$, an intermediately doped region may have a dopant concentration of about 1E12-1E13 cm$^{-3}$, and a heavily doped region may have a dopant concentration of about 1E13-1E14 cm$^{-3}$. Providing other dopant concentrations for the different types of doped regions may also be useful. For example, the dopant concentration range may be varied, depending on the technology node. P-type dopants may include boron (B), fluorine (F), aluminum (Al), indium (In) or a combination thereof, while n-type dopants may include phosphorous (P), arsenic (As), antimony (Sb) or a combination thereof.

The device is disposed on a substrate 201. The substrate is a semiconductor substrate, such as a silicon substrate. Other types of semiconductor substrates may also be useful. In one embodiment, the substrate 201 is a lightly doped substrate. In one embodiment, the substrate is lightly doped with dopants of a second polarity type. For example, the substrate is a lightly doped p-type (p) substrate. Providing an undoped substrate or a substrate doped with other types of dopants may also be useful.

A cell region 284 is provided in the substrate. The cell region, for example, is a cell region in which the memory cell is disposed. Although one cell region is shown, the memory device may include a plurality of cell regions having memory cells interconnected to form a memory array. Additionally, the substrate may include other types of device regions, depending on the type of device or IC. For example, the device may include device regions for high voltage (HV), medium voltage (MV) and/or low voltage (LV) devices.

The cell region includes first and second wells 250 and 207. The first well serves as a control well for a control gate while the second well serves as a transistor well. For example, the transistor well serves as a well for access (or select) and storage transistors 110 and 130. In one embodiment, the control gate includes a control capacitor 150. The control capacitor may be MOS capacitor. Other types of control gates may also be useful.

As shown, the wells are disposed adjacent to each other. The first well 250 accommodates the control capacitor and the second well 207 accommodates the access and storage transistors. The first (or control) well includes capacitor type dopants and the second (or transistor) well includes transistor well type dopants. In one embodiment, the control well is a lightly doped well. For example, the dopant concentration of the control well may be about 1E11-1E12 cm$^{-3}$. As for the transistor well, it may be a lightly to intermediately doped well. For example, the dopant concentration of the transistor well may be about 1E12-1E13 cm$^{-3}$. Other control and/or transistor well dopant concentrations may also be useful. The first and second wells may serve as device wells for HV and MV devices respectively. For example, the first well is sufficiently doped to form a HV device well while the second well is sufficiently doped to form a MV device well.

In one embodiment, at least one control contact region 252 which minimizes contact resistance is disposed within the first well. For example, the first well encompasses the control contact region. The control contact region is a heavily doped region. In one embodiment, the control well and the control contact region include capacitor type dopants. For example, the control contact region is heavily doped with capacitor type dopants. The first well serves as a control well for a control gate and the control contact region serves as a contact region to the control well. A capacitor contact plug (not shown) is disposed above the control contact region. The capacitor contact plug, for example, may be a conductive contact plug, such as a tungsten contact plug. Other types of conductive contact plugs may also be useful. The capacitor contact plug, for example, couples the control well to the CGL of the memory device. The control gate includes a control capacitor. The control capacitor may be MOS capacitor. Other types of control gate may also be useful.

The first and second wells include a depth $D_W$. In one embodiment, the first well 250 includes a depth $D_{W1}$ and the second well 207 includes a depth $D_{W2}$. For example, the wells have a depth from the surface of the substrate to $D_{W1}$ and $D_{W2}$. Although the first and second wells are illustrated to have about the same depth dimension from the surface of the substrate, it is to be understood that the wells may also include different depth dimensions. For example, $D_{W1}$ and $D_{W2}$ may not be about equal to each other.

The polarity type of the control well may depend on the polarity type of the control gate. In one embodiment, the polarity of the capacitor type dopants depends on the polarity type of the control capacitor. For example, the capacitor type dopant is p-type for a p-type MOS capacitor or n-type for a n-type MOS capacitor. As for the polarity of the transistor well type dopants, it is the opposite polarity type to the transistor. In one embodiment, the transistor well dopants are second polarity type dopants for a first type transistor with first polarity type dopants. For example, the transistor well type dopants are p-type for a n-type transistor. In one embodiment, the transistor well is of opposite polarity type to the control well. For example, the transistor well dopants are second polarity type dopants for a first type control well with first polarity type dopants. The first polarity type may be n-type and the second polarity type may be p-type. Other configurations of transistor and control wells may also be useful. For example, the first polarity type may be p-type and the second polarity type may be n-type.

An isolation well 208 may be provided in the substrate 201. The isolation well may be a deep isolation well disposed below the first and second wells. In one embodiment, the isolation well is a common isolation well of a memory chip. The isolation well, for example, encompasses a plurality of memory arrays of a memory chip. The isolation well includes isolation well dopants. In one embodiment, the isolation well is lightly doped with isolation well dopants. The isolation well dopants are, for example, opposite polarity type to the substrate type. In one embodiment, the isolation well dopants are first polarity type dopants for a second polarity type substrate. For example, a n-type isolation well is provided for a p-type substrate. Other configurations of isolation well and substrate may also be useful. The isolation well 208 serves to isolate the first and second wells 250 and 207 from the substrate 201 to improve noise immunity of the memory device. The isolation well 208 has a depth $D_N$ from the surface of the substrate. The isolation well 208 may be referred to as the first isolation well.

In one embodiment, a HV well region 210 may be provided within the isolation well 208 in the substrate. In one embodiment, the HV well region encompasses the control and transistor wells. For example, the HV well region separates the first and second wells 250 and 207 from the isolation well 208. In one embodiment, the HV well region is a common HV well region of a memory array. The HV well region, for example, encompasses a plurality of memory cells of a memory array. The HV well region includes HV well dopants. In one embodiment, the HV well region 210 is lightly doped with HV well dopants. The HV well dopants are, for example, opposite polarity type to the isolation well dopants. In one embodiment, the HV well dopants are second polarity type for first polarity type isolation well dopants. For example, a p-type HV well region is provided for a n-type isolation well. Other configurations of HV well region 210 and isolation well 208 may also be useful. In one embodiment, the HV well region 210 and first well 250 are doped with opposite polarity type dopants. For example, a p-type HV well region is provided for n-type isolation and control wells. The HV well region serves to improve isolation of the control well during device or programming operations. Providing a HV well region enables selective programming and reduces cell size layout.

The HV well region has a depth $D_P$ from the surface of the substrate. The HV well region may be referred to as the second isolation well.

In one embodiment, $D_P$ is shallower than $D_N$ and deeper than $D_W$. In general, $D_W$ is less than $D_P$ which is less than $D_N$ ($D_W<D_P<D_N$). For example, $D_N$ may be about 1.8 µm while $D_P$ may be about 1.2-1.8 µm. Other suitable depth dimensions for $D_W$, $D_N$ and $D_P$ may also be useful.

A cell isolation region 280, as shown, separates the first and second wells as well as the other device regions. In one embodiment, the cell isolation region 280 sufficiently overlaps the first and second wells 250 and 207 to isolate the wells. For example, the cell isolation region overlaps a portion of the first and second wells. In one embodiment, a bottom portion of the wells extends below the cell isolation region. For example, the first and second wells extend below and underlap the cell isolation region. Other configurations of the cell isolation region and wells may also be useful. The cell isolation region defines the active regions in the first and second wells. For example, the cell isolation region defines the active transistor region 222 and the active capacitor region 220. The cell isolation region is, for example, a shallow trench isolation (STI) region. Providing other types of isolation region may also be useful.

The cell isolation region has a depth $D_I$. For example, the cell isolation region has a depth from the surface of the substrate to $D_I$. In one embodiment, the cell isolation region has a depth which is shallower than the control and transistor wells. For example, $D_I$ is less than the depth of the first and second wells and the HV well region ($D_I<D_W<D_P$). For example, $D_I$ may be about 0.5 µm while $D_W$ may be about 0.8-1.2 µm. Other suitable depth dimensions for $D_I$ and $D_W$ may also be useful.

Access and storage transistors are disposed on the active transistor region in the second or transistor well. A transistor includes a gate disposed between first and second S/D regions. The transistor S/D regions, for example, include dopants of the same polarity type as the transistor type. For example, p-type transistors have S/D regions with p-type dopants. The S/D regions, for example, are heavily doped regions. The gate is disposed on the substrate while the S/D regions are disposed adjacent to the gate in the active transistor region of the substrate. A gate includes a gate electrode 228 and a gate dielectric 226. The gate electrode 228, for example, may be a polysilicon gate electrode and the gate dielectric 226 may be a silicon oxide gate dielectric. Other types of gate electrode or dielectric materials may also be useful.

Dielectric spacers (not shown) may be provided on the gate sidewalls of the transistors and capacitor. The spacers may be used to facilitate forming self-aligned S/D regions. For example, spacers are formed after S/D extension regions are formed in the active transistor region. Spacers may be formed by, for example, forming a spacer layer on the substrate and anisotropically etching it to remove horizontal portions, leaving the spacers on sidewalls of the gates. After forming the spacers, an implant is performed to form S/D regions in the active transistor region. For example, the spacers may function as implant masks to align the S/D regions.

As discussed, the access transistor 110 includes first and second access S/D regions 212 and 214 heavily doped with transistor type dopants in the active transistor region 222 and an access gate 216 on the substrate. The access gate 216 includes an access gate electrode 228 over an access gate dielectric 226. The access gate may be referred to as a select gate. The storage transistor 130 includes first and second storage S/D regions 232 and 234 heavily doped with transistor type dopants in the substrate and a storage gate 236 on the substrate. The storage gate includes a storage gate electrode 228 over a storage gate dielectric 226. The storage gate may be referred to as a floating gate. The access and storage transistors 110 and 130 are coupled in series. In one embodiment, the second access S/D region 214 and second storage S/D region 234 form a common S/D region of the transistors. Other configurations of series connection for the access and storage gates may also be useful.

In some embodiments, the first and second access S/D regions 212 and 214 are self-aligned to first and second sides of the access gate. In one embodiment, the second storage S/D region 234 is self-aligned to the second side of the storage gate while the first storage S/D region 232 is displaced away from the first side of the storage gate, as shown in FIGS. 2b-2d. For example, the self-aligned S/D regions are aligned to transistor gate sidewall spacers while the non-self-aligned S/D region is displaced away from the storage gate sidewall spacer. Other configurations of S/D regions may also be useful. In one embodiment, the first storage (or non-self-aligned) S/D region is displaced a distance from the gate sidewall spacer. For example, the non-self-aligned S/D region may be displaced about 0.2 µm from the storage gate sidewall spacer. Other displacement distances from the gate may also be useful. For example, the displacement distance may be varied depending on the process overlay control, desired junction breakdown voltage (BV) and/or cell read current requirement.

A transistor S/D region, in one embodiment, may include S/D extension regions which extend beyond the S/D region. The S/D extension regions include, for example, halo and lightly doped drain (LDD) regions. In one embodiment, the LDD region extends beyond the halo region. For example, the LDD region underlaps a portion of the transistor gate. The halo region is a lightly doped region with second polarity type dopants. As for the LDD region, it is a lightly doped region with first polarity type dopants. For example, the halo region includes p-type dopants for a n-type transistor while the LDD region includes n-type dopants for n-type transistors.

In one embodiment, the S/D extension regions include a depth less than the S/D region. The depth of the S/D region is, for example, about 0.1 µm. In one embodiment, the LDD region has a depth shallower than the halo region. As shown in FIG. 2b, the LDD region 242 extends beyond the first storage (or non-self-aligned) S/D region 232 and halo region 244 to underlap a portion of the storage gate 236. For example, the LDD region overlaps the halo region. For example, the depth of the LDD region 242 is about 0.05 m while the depth of the halo region 244 is about 0.05-0.1 µm. Other suitable depth dimensions for the S/D region and S/D extension regions may also be useful. For example, the depth dimensions may be varied depending on the technology node and device operating voltages. Other configurations of S/D extension regions may also be useful.

In another embodiment, a S/D extension region without halo region is provided. For example, a S/D extension region includes only a LDD region 242 without halo region, as shown in FIG. 2c. In one embodiment, the LDD region in such configuration includes a graded LDD region.

In yet another embodiment, a deeply doped S/D extension region without halo region is provided. For example, a S/D extension region without halo region may include a deep LDD region 246. In the case of a deep LDD region, the depth of the LDD region may be deeper than the S/D region. As shown in FIG. 2d, a deep LDD region 246 encompasses the first storage S/D region 232. For example, the depth of the S/D region may be about 0.1 m and the depth of the deep LDD region 246 may be about 0.1-0.3 µm. Other suitable depth dimensions may also be useful. In one embodiment, the LDD region in such configuration includes a highly graded LDD region.

Although, S/D extension regions of the self-aligned S/D regions (i.e. S/D regions 212, 214 and 234) are not shown, it is to be understood that the S/D extension regions as illustrated in FIGS. 2b-2d are also provided for these self-aligned S/D regions. For example, the transistor S/D regions 212, 214, 234 and 232 include similar configurations of S/D extension regions.

The control capacitor 150 is disposed on the first well 250. The control capacitor includes a control gate 256 disposed on the substrate over the active capacitor region 220. The control gate includes a control gate electrode 228 over a control gate dielectric 226. The control gate electrode 228, for example, may be polysilicon control gate electrode and the control gate dielectric 226 may be silicon oxide control gate dielectric. Other types of gate electrode or dielectric materials may also be useful. The control gate electrode, in one embodiment, is doped with capacitor type dopants. For example, the control gate electrode is heavily doped with same polarity type dopants as the control well.

At least one control contact region 252 is disposed in the active capacitor region. For illustration purpose, two control contact regions are formed adjacent to the sides of the control gate. Other suitable number of control contact region may also be useful, depending on the desired cell size. In one embodiment, the control contact region is a heavily doped region disposed within the control well. The control contact region is, for example, a heavily doped region with a depth less than the control well. For example, the depth of the control contact region may be about 0.1-0.2 µm and the depth of the control well may be about 0.8-1.2 µm. Other suitable depth dimensions for the control well and control contact region may also be useful. In one embodiment, the control contact region is disposed adjacent to the control gate without underlapping the control gate. For example, the control contact region may be positioned away from the gate sidewalls and self-aligned with sidewall spacers on the sides of the control gate. Other configurations of the control contact region may also be useful. For example, the control contact region may be aligned to the sidewalls of the control gate.

The control contact region serves as a contact region to provide biasing for the control well. The control contact region, for example, improves the conductive connection between a conductive contact plug or well tap (not shown) and the control well. The control well serves as the second (or well) capacitor plate while the control gate electrode 228 serves as the first (or gate) capacitor plate. In one embodiment, the control gate electrode is doped before forming the control contact region. For example, a gate electrode layer deposited on the substrate is pre-doped with capacitor type dopants and patterned to form the control gate electrode. In the case where capacitor type dopants and transistor type dopants are the same polarity, the transistor S/D regions and control contact regions may be formed at the same time.

In one embodiment, the control gate and storage gate electrodes 228 are commonly coupled. In one embodiment, the control gate 256 and storage gate 236 are formed of the same gate layer. For example, patterning the gate layers create the control and storage gates. In such cases, the control gate 256 and storage gate 236 are formed of the same material. For example, the control gate electrode and gate dielectric layers are formed of the same material and thickness as the storage gate electrode and gate dielectric layers. In one embodiment, the same gate dielectric layer used for the storage and control gates includes a thickness suitable for MV devices. The gate electrodes are, for example, doped with capacitor type dopants. Providing gate electrodes doped with other dopant types may also be useful. In one embodiment, the access, storage and control gates are formed from the same gate layers. For example, the access gate is formed from the same gate layers as the control and storage gates. Other configurations of the gates may also be useful. For example, the gates may be formed from different gate layers.

Metal silicide contacts (not shown) may be provided on contact regions of the memory cell. The metal silicide contacts, for example, may be nickel or nickel-based metal silicide contacts. Other suitable types of metal silicide contacts, including cobalt or cobalt-based metal silicide contacts, may also be useful. In one embodiment, metal silicide contacts are provided on the transistor S/D regions, active capacitor regions and the access gate. A silicide block 261 is disposed over the storage and control gates. As shown, the silicide block wraps around the sides of the gates and extends over the substrate to overlap a portion of the storage S/D regions 234 and 232 and the control contact regions 252. For example, the silicide block wraps around sidewall spacers of the gates and overlaps the S/D extension region 242 of the first storage S/D region. The silicide block, for example, is a dielectric material, such as silicon oxide or silicon nitride. Other types of silicide blocks may also be useful. Providing a silicide block over the storage and control gates prevents formation of silicide contacts over these gates. This improves data retention.

The first access S/D region 212 is coupled to a SL of the memory device. The first storage S/D region 232 is coupled to a BL of the memory device. The access gate 216 is coupled to a SGL of the memory device. The control contact region 252 is coupled to a CGL of the memory device. In some embodiments, the control gate 256 is implemented as a control capacitor 150 and the first or non-self-aligned storage S/D region 232 which is coupled to BL is implemented as an erase terminal. In one embodiment, the SGL is disposed along a first direction, such as a wordline direction, while the BL is disposed along a second direction, such as the bitline direction which is perpendicular to the wordline direction. The CGL may be disposed along the wordline direction and the SL is disposed along the bitline direction. Other configurations of BL, CGL, SGL and SL may also be useful. For example, the memory cells of an array may be coupled to a common SL (CSL) disposed along a wordline direction.

The various conductive lines of the memory cell may be disposed in metal levels (M) of the device. Conductive lines disposed in the same direction may be provided in the same metal level. For example, conductive lines disposed along the BL direction may be disposed in metal level $M_x$ while conductive lines disposed along the WL direction may be disposed in $M_{x+1}$ of the device. Other configurations of conductive lines and metal levels may also be useful.

The memory cell as described has improved or more efficient programming due to increased capacitive coupling ratio. For example, the layout of the control gate (CG) and floating gate (FG) can be designed to have an area ratio to produce the desired capacitive coupling ration. In some embodiments, an area ratio of CG:FG may be about 0.8:0.2. For example, width (W)×length (L) of the floating gate may be about 0.4×0.28, while W×L of the control gate may be about 1.6×0.84. Providing other CG:FG area ratios may also useful. By providing a large area for the control gate, a medium bias on the control well can be generated. This bias is transferred to the floating gate for efficient programming of the memory cell. Reducing the higher voltage required for the control well also allows a smaller control capacitor to be formed. This further reduces the size of the device.

Figure 3B:
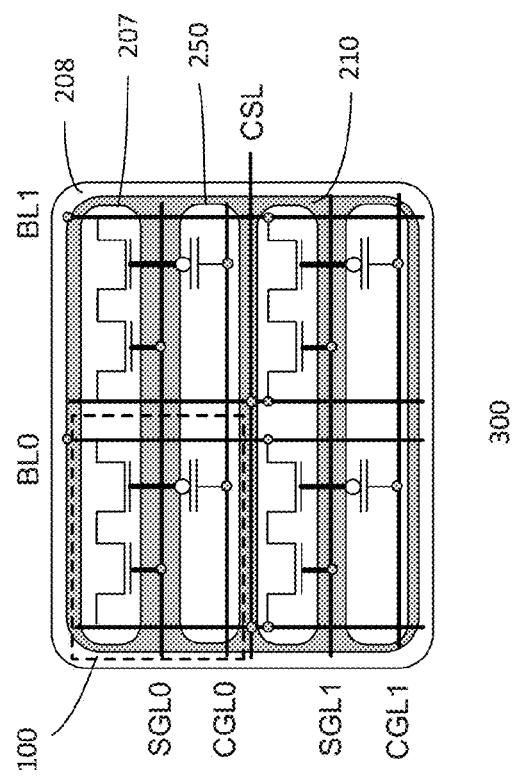
FIGS. 3a-3b show schematic diagrams of embodiments of an array of memory cells.
Figure 3A:
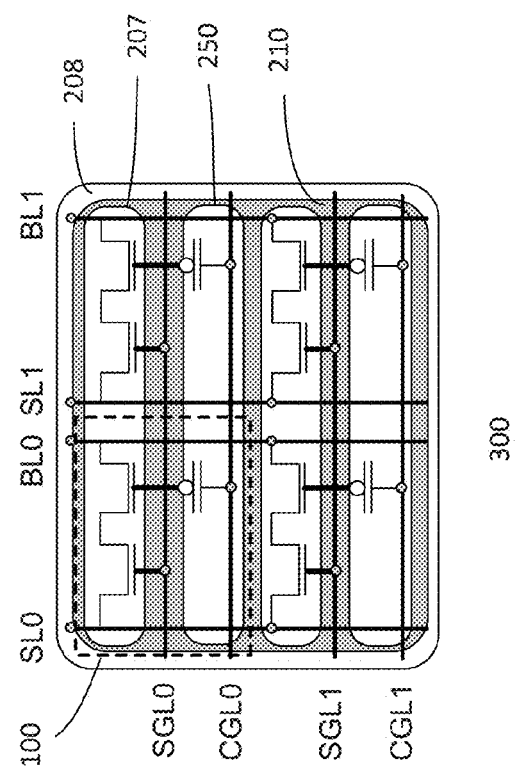

FIGS. 3a-3b show schematic diagrams of embodiments of an array 300 of memory cells. A portion of the array is shown with, for example, four memory cells 100, such as those described in FIGS. 1 and 2a-2d. Common elements may not be described or described in detail. The array of memory cells may be formed on a substrate having first and second wells 250 and 207 disposed within a HV well region 210. The HV well region is, in some embodiments, surrounded by an isolation well 208 which is common to memory arrays of a memory chip. In one embodiment, the first and second wells extend across multiple columns of interconnected memory cells of an array. The first and second wells, for example, form common first and second wells of a memory array. Other configurations of first and second wells may also be useful.

As shown in FIG. 3a, the memory cells are interconnected to form two columns connected by BLs (BL0 and BL1) and SLs (SL0 and SL1) and two rows of memory cells connected by SGLs (SGL0 and SGL1) and CGLs (CGL0 and CGL1). In one embodiment, the SLs (SL0 and SL1) of each column of memory cells are coupled to separate source terminals. For example, SL0 and SL1 are coupled to first and second source terminals and BL0 and BL1 are coupled to first and second drain terminals. In one embodiment, erase operations are performed at the drain terminals of the memory cells. For example, the drain terminals or the non-self-aligned S/D regions serve as erase terminals. Coupling separate columns of memory cells to separate (or dedicated) source terminals form an AND-type array configuration. For example, the AND-type array configuration illustrated has access and storage transistors of each column coupled to separate SL and BL terminals respectively. Having an AND-type array configuration provides more reliable memory cell operation within an array.

In another embodiment, the SLs of each column of memory cells are coupled to a common source terminal. As shown in FIG. 3b, the SLs of each column of memory cells may be coupled to a common source line (CSL) disposed in a wordline direction. Coupling separate columns of memory cells to a common source terminal forms a NOR-type array configuration. The NOR-type configuration illustrated has access transistors in separate columns coupled to a CSL while the storage transistors in separate columns are coupled to separate drain terminals. Having a NOR-type array configuration provides random access to the memory cell and reduces footprint of an array. Other configurations of an array may also be useful.

Although a 2×2 portion of an array is shown, it is understood that the array may include numerous rows and columns. For example, the memory array may form a memory block.

The memory cell of FIGS. 1 and 2a-2d, in one embodiment, is configured to include first type transistors and a first type capacitor. For example, the access and storage transistors are same polarity type to that of the control capacitor. In one embodiment, the first type is n-type. For example, the memory cell is configured with n-type transistors and a n-type capacitor. In such cases, the transistor (or second) well 207 and capacitor (or first) well 250 include opposite polarity type dopants. The transistor well includes second polarity type or p-type dopants while the control well includes first polarity type or n-type dopants. The transistor S/D regions and control contact regions are n-type. Furthermore, the gate electrodes are doped with capacitor type dopants. For example, the gate electrodes are doped with first polarity type dopants for a first polarity type control capacitor. Other configurations of the memory cell may also be useful. For example, the memory cell may be configured to include a first polarity type capacitor for second polarity type transistors.

In one embodiment, a memory cell with first type transistors and a first type capacitor may include various operating modes. The first type is, for example, n-type. The memory cell includes a control capacitor coupled to a storage gate. Table 1 below shows various biasing voltages at various terminals of a memory cell for program, erase and read operating modes:

TABLE 1

| | Signals | | | | | | | | |
|---|---|---|---|---|---|---|---|---|---|
| | CGL | | BL | | SL | | SGL | | PW (transistor |
| Modes | sel | unsel | sel | unsel | sel | unsel | sel | unsel | well or HV well) |
| PGM: FN (bit) | 18.5 | 0 V | 0 V | $V_{dd}$ | 0 V | $V_{dd}$ | $V_{dd}$ | $V_{dd}$ | 0 V |
| ERS: FN (block or column) | 0 V | 0 V | 12.5 V | 12.5 V | 0 V | 0 V | 0 V | 0 V | 0 V |
| Read (in A) | 3 V | 0 V | 1 V | 0 V | 0 V | 0 V | $V_{dd}$ | 0 V | 0 V |

The values in Table 1 are exemplary using, for example. Fowler-Nordheim (FN) tunneling for program and erase operations. For example, the values are for an operating voltage $V_{dd}$ equal to about 5V. Other suitable voltage values may also be useful.

The memory cell may operate in a Fowler-Nordheim (FN) tunneling program mode. To effect a FN tunneling program operation, the various select (sel) signals for such a program operation are provided at the various terminals of the selected memory cell. In the program mode, electron carriers tunnel through from the transistor well to the floating gate (FG). Other suitable types of programming modes, such as channel hot electron (CHE) injection programming mode, may also be useful. In the CHE programming mode, for example, electron carriers are injected from the transistor channel to the FG on the drain side.

The memory cell may operate in FN tunneling erase mode. To effect a FN tunneling erase mode, the various sel signals for such an erase operation are provided at the various terminals of the selected memory cell. In the erase mode, electron carriers move from the FG to the transistor well from the drain side of the gate. For example, the drain terminal serves as an erase terminal. The erase mode may effect a memory block or column erase operation.

As for a read operation, the various sel signals for a read operation are provided at the various terminals of the selected memory cell to effect the read operation.

The memory cell as described in FIG. 1 and FIGS. 2*a*-2*d* results in advantages. The configuration and arrangement of the memory cell as described couples a non-self-aligned S/D region to the BL of the memory device. The non-self-aligned S/D region serves as a drain or erase terminal of the memory cell. This configuration of drain or erase terminal suppresses gate-induced drain leakage (GIDL) current and improves gated breakdown voltage (BV). Thus, a higher erase voltage is allowed. In addition, the overall macro size of the memory device can be reduced by using only a positive charge pump.

In one embodiment, the non-self-aligned S/D region includes S/D extension regions such as LDD and halo regions, as shown in FIG. 2*b*. In another embodiment, the S/D extension region without halo region may be provided, as shown in FIG. 2*c*. This configuration of S/D extension region provides a graded LDD region and further improves gated BV to allow higher erase voltage. In the alternative, a S/D extension region without halo region may include a deeply doped LDD region, as shown in FIG. 2*d*. For example, the S/D extension region encompasses the S/D region. The deeply doped LDD region includes a highly graded LDD region which resembles a mini high voltage doubled diffused device at BL which further improves erase performance.

Figure 4:
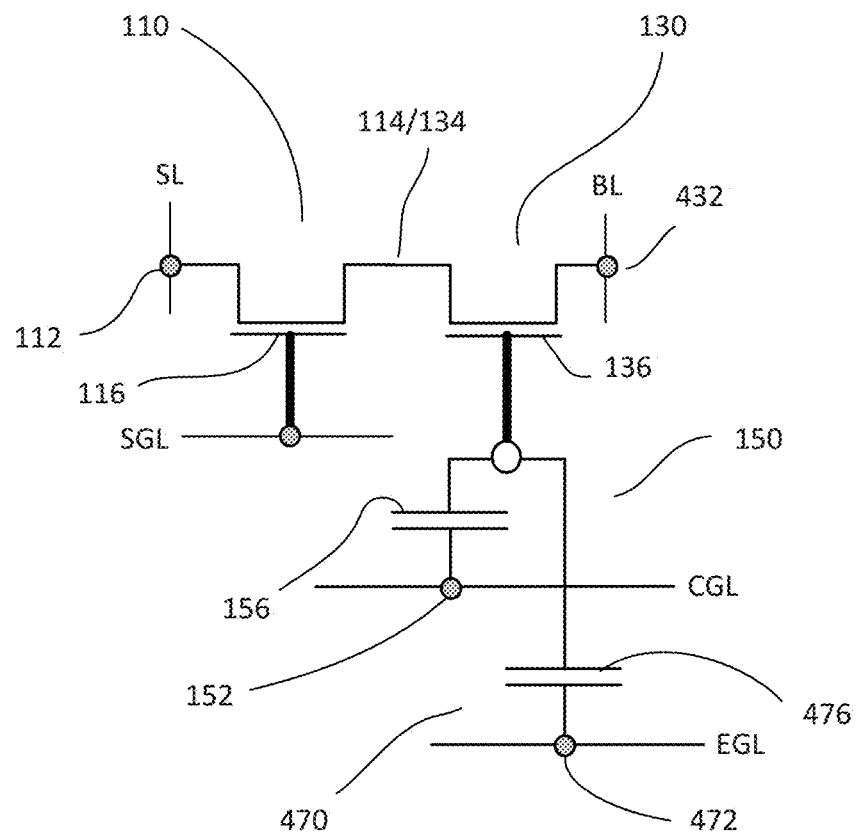
FIG. 4 shows a schematic diagram of another embodiment of a memory cell.

FIG. 4 shows a schematic diagram of another embodiment of a memory cell 400 of a memory device. The memory cell is similar to that described in FIG. 1 and FIGS. 2*a*-2*d*. Common elements may not be described or described in detail. The memory cell 400 shown is a non-volatile memory cell. For example, the memory cell is a non-volatile MTP memory cell.

As shown in FIG. 4, memory cell 400 includes first and second transistors 110 and 130 and first and second capacitors 150 and 470. A transistor includes a gate between first and second diffusion regions. The diffusion regions of a transistor are heavily doped regions with first polarity type dopants. The polarity type determines the type of transistor. For example, the first polarity may be n-type for a n-type transistor or p-type for a p-type transistor. The diffusion regions of the first and second transistors serve as transistor source/drain (S/D) regions.

A gate includes a gate electrode and a gate dielectric. The first transistor 110 serves as an access transistor while the second transistor 130 serves as a storage transistor. For example, the access transistor 110 includes a first access S/D region 112, a second access S/D region 114 and an access gate 116; the storage transistor 130 includes a first storage S/D region 432, a second storage S/D region 134 and a storage gate 136. The access gate 116 may be referred to as a select gate and the storage gate 136 may be referred to as a floating gate. The access and storage transistors 110 and 130 are coupled in series. For example, the second access S/D region and second storage S/D region 114 and 134 form a common S/D region of the transistors.

In one embodiment, the first and second capacitors 150 and 470 are MOS capacitors. A MOS capacitor, for example, includes a gate with a gate electrode and a gate dielectric. The first capacitor 150 serves as a control capacitor while the second capacitor 470 serves as an erase capacitor. The control capacitor includes a control gate 156 the erase capacitor includes an erase gate 476.

The control gate 156 forms the control capacitor 150. The control capacitor includes first and second control capacitor plates separated by a dielectric layer. The control gate electrode, for example, serves as the first control (or control gate) capacitor plate while a control well serves as the second control (or control well) capacitor plate. For example, a control gate dielectric layer disposed over the second control capacitor plate separates the first and second control capacitor plates. At least one control contact region 152 is disposed adjacent to the control gate. The control contact region is a heavily doped region. In one embodiment, the contact region is heavily doped with control type dopants to minimize contact resistance. For example, control type dopants may be n-type for a n-type control capacitor or p-type for a p-type control capacitor. The control contact region 152 serves as a contact region to the control well. In one embodiment, the control gate is coupled to the storage gate. For example, the gates are formed from a common gate conductor.

The erase gate 476 forms the erase capacitor 470. In one embodiment, the erase capacitor includes an erase diffusion region 472. The erase diffusion region is, for example, a heavily doped S/D region disposed adjacent to a side of the erase gate. The erase S/D region 472 serves an erase terminal of the memory cell. In one embodiment, the erase S/D region is heavily doped with erase type dopants. For example, erase type dopants may be n-type for a n-type erase capacitor or p-type for a p-type erase capacitor. In one embodiment, the erase gate is coupled to the storage gate. For example, the gates are formed from a common gate conductor. The erase capacitor includes first and second erase capacitor plates separated by a dielectric layer. The erase gate electrode, for example, serves as the first erase (or erase gate) capacitor plate while an erase well serves as the second erase (or erase well) capacitor plate. For example, an erase gate dielectric layer disposed over the second erase capacitor plate separates the first and second control capacitor plates.

The S/D regions of the transistors 110 and 130 and erase capacitor 470 may be self-aligned or non-self-aligned S/D regions. In one embodiment, the transistor S/D regions 112, 114, 134 and 432 are self-aligned S/D regions while the erase S/D region 472 is a non-self-aligned S/D region. For example, the transistor S/D regions are aligned to transistor gate sidewall spacers while the erase S/D region is displaced from the erase gate sidewall spacer. Other configurations of S/D regions may also be useful.

The S/D regions of the transistors 110 and 130 and erase capacitor 470 include S/D extension regions. In one embodiment, the S/D extension regions include halo and lightly doped drain (LDD) regions. The halo region is a lightly doped region with second polarity type dopants. As for the LDD region, it is a lightly doped region with first polarity type dopants. For example, the halo region includes p-type dopants for a n-type transistor or capacitor while the LDD region includes n-type dopants for a n-type transistor or capacitor. Other configurations of S/D extension regions may also be useful. For example, providing only a LDD region without halo region may also be useful. A S/D extension region without halo region may, for example, include a deeply doped LDD region.

In one embodiment, the control and erase gates 156 and 476 are commonly coupled to the storage gate 136. For example, the control and erase capacitors isolate the storage gate, making it a floating gate. Other configurations of the storage, erase and control gates may also be useful. In one embodiment, a common gate conductor couples the erase and control gates to the storage gate. For example, the same gate layers (i.e. gate dielectric and gate electrode layers) form the control gate 156, storage gate 136 and erase gate 476. In one embodiment, the same gate dielectric layer used for the storage, erase and control gates includes a thickness suitable for medium voltage devices. Other suitable dielectric thickness dimensions may also be useful.

The first access S/D region 112 is coupled to a source line (SL) of the memory device. The first storage S/D region 432 is coupled to a bit line (BL) of the memory device. The first access S/D region may serve as a source terminal and the first storage S/D region may serve as a drain terminal. The access gate 116 of the first transistor 110, or the select gate of the memory cell 400, is coupled to a select gate line (SGL) of the memory device. The control contact region is coupled to a control gate line (CGL) of the memory device. The erase S/D region of the erase capacitor is coupled to an erase gate line (EGL) of the memory device. The erase S/D region may serve as an erase terminal. In one embodiment, the SGL is disposed along a first direction, such as a wordline direction, while the BL is disposed along a second direction, such as the bitline direction. The first and second directions, for example, are orthogonal to each other. As for the CGL and EGL, they are disposed along the wordline direction and the SL is disposed along the bitline direction. The memory cells of an array may be coupled to a common EGL while SL is separate for each column of memory cells. Other configurations of BL, CGL, EGL, SGL and SL may also be useful. For example, the memory cells of an array may be coupled to a common SL (CSL) disposed along a wordline direction.

Figure 5A:
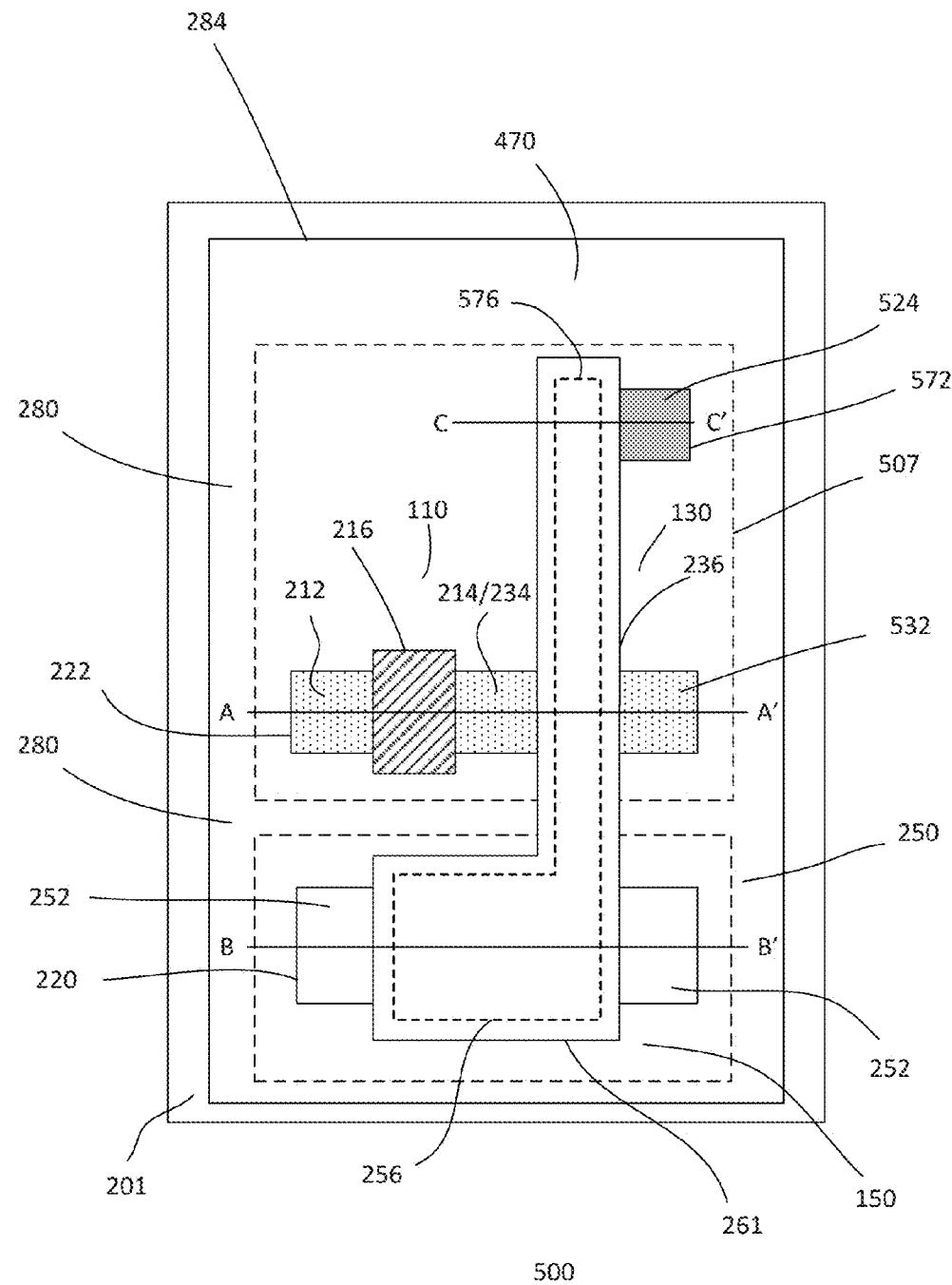
FIG. 5a shows a top view of various embodiments of a memory device and FIGS. 5b-5d show cross-sectional views of various embodiments of a memory device.
Figure 5B:
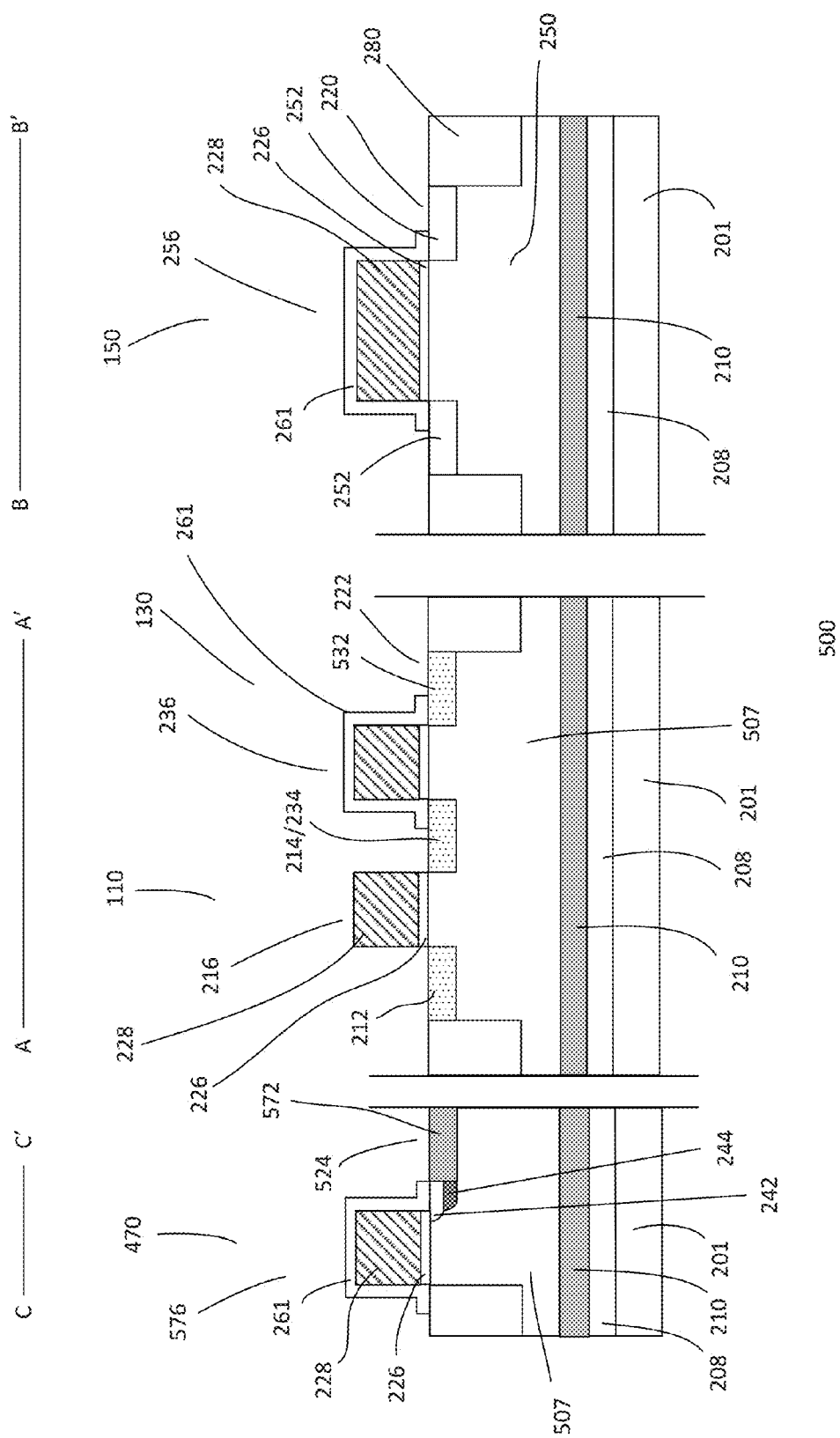
Figure 5C:
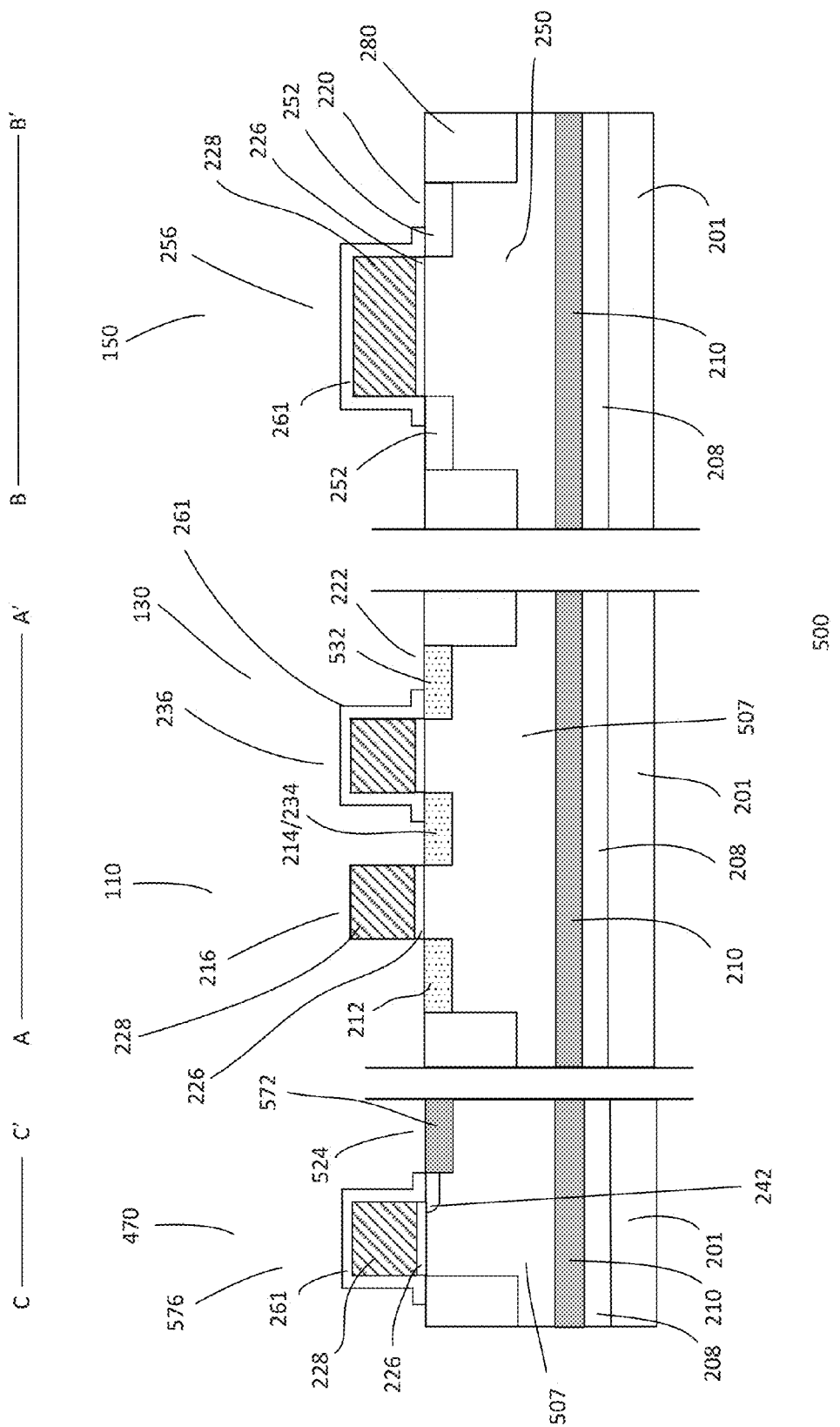
Figure 5D:
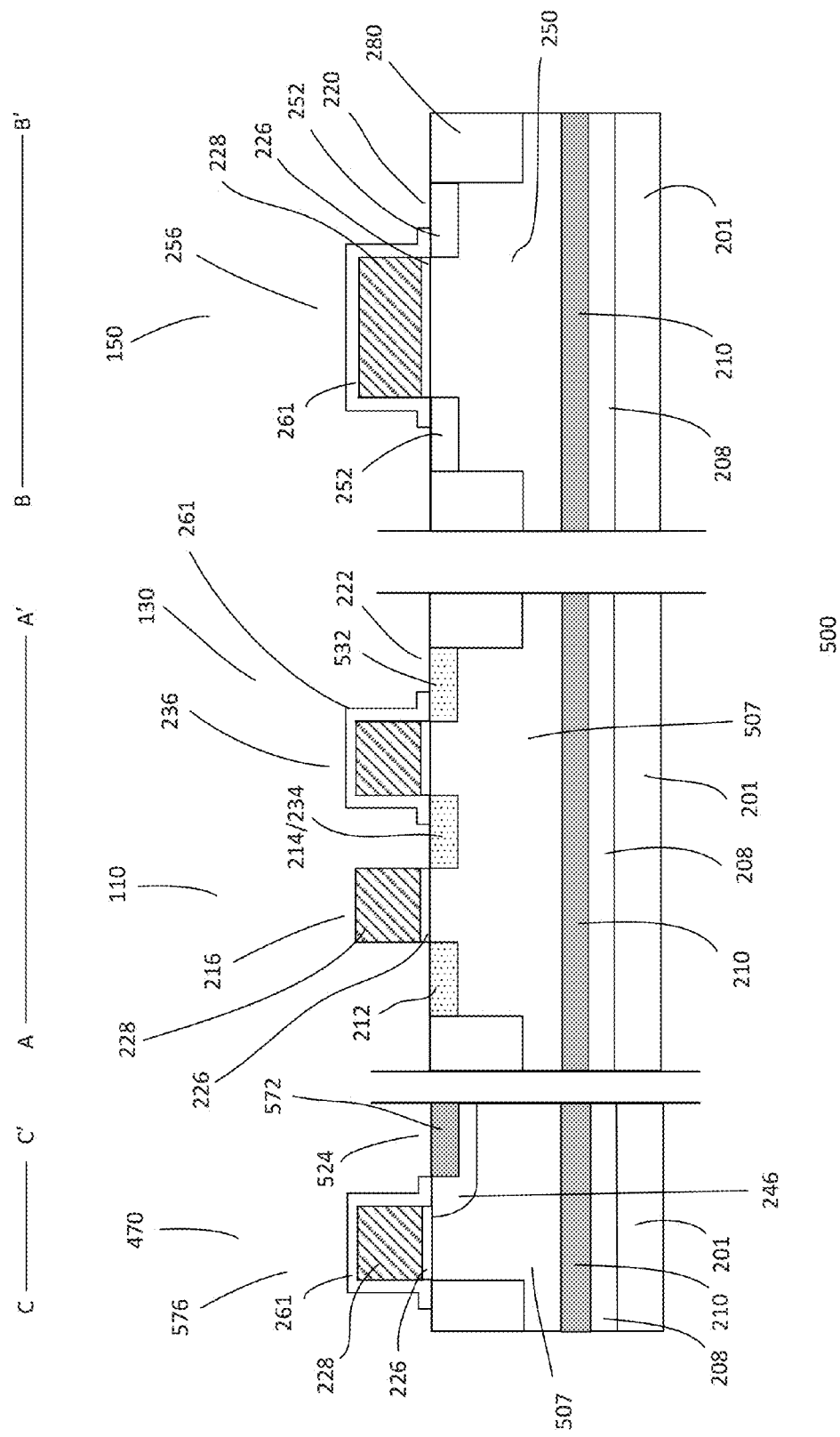

FIG. 5*a* shows a top view of various embodiments of a memory device and FIGS. 5*b*-5*d* show cross-sectional views of various embodiments of the memory device. The memory device includes a memory cell 500. The cross-sectional views are, for example, along A-A', B-B' and C-C' of the memory cell 500. The memory cell is similar to that described in FIGS. 1, 2*a*-2*d* and 4. Common elements may not be described or described in detail. The memory cell 500 shown is a NVM cell. For example, the memory cell is a non-volatile MTP memory cell.

The device is disposed on a substrate 201 and a cell region 284 is provided in the substrate. The substrate and cell region are similar to that described in FIGS. 1 and 2*a*-2*d*. The cell region includes first and second wells 250 and 507 disposed adjacent to each other. The first well serves as a control well for a control gate while the second well serves as a transistor well. In one embodiment, the control gate includes a control capacitor 150. For example, the first well 250 accommodates the control capacitor. The control capacitor may be a MOS capacitor. Other types of control gates may also be useful.

In one embodiment, the first (or control) well is a lightly doped well. The capacitor well may be sufficiently doped to form a HV device well. In one embodiment, at least one control contact region 252 is disposed within the control well. The control contact region is a heavily doped region disposed within the first well. For example, the first well encompasses the control contact region. In one embodiment, the control well and the control contact region include same polarity dopants. The control well and the control contact region, for example, include control type dopants. The control contact region provides a biasing to the control well. A capacitor contact plug (not shown) may be disposed above the control contact region to couple the control well to the CGL of the memory device.

As shown, the second (or transistor) well accommodates the first and second transistors 110 and 130 and an erase capacitor 470. For example, the second well serves as a common device well to the access and storage transistors and the erase capacitor. The transistor well includes transistor well type dopants. For example, the transistor well is lightly to intermediately doped with transistor well type dopants. The transistor well may be sufficiently doped to form a MV device well. In one embodiment, transistor S/D regions 212, 214, 234 and 236 and an erase S/D region 572 are disposed within the second well. The S/D regions, for example, are heavily doped regions. For example, transistor S/D regions are heavily doped with transistor type dopants while erase S/D regions are heavily doped with erase type dopants.

The polarity type of the control or erase type dopants depend on the polarity type of the capacitor. In one embodiment, the polarity type of the control type dopant depends on the polarity type of the control capacitor. For example, the control type dopant is p-type for a p-type control capacitor or n-type for a n-type control capacitor. In one embodiment, the polarity type of the erase type dopant depends on the polarity type of the erase capacitor. For example, the erase type dopant is p-type for a p-type erase capacitor or n-type for a n-type erase capacitor. The control and erase type dopants may be same polarity types. In one embodiment, the erase and control capacitors are first polarity type capacitors. For example, the first polarity may be n-type for n-type capacitors or p-type for p-type capacitors. Other configurations of control and erase capacitors may also be useful.

As for the polarity of the transistor well type dopants, it is the opposite polarity type to the transistor. In one embodiment, transistor well type dopants are second polarity type dopants for a first type transistor with first polarity type dopants. For example, transistor well type dopants are p-type for a n-type transistor. The transistor S/D regions, in one embodiment, include dopants of the same polarity type to the transistor type. For example, the transistor type dopants may be n-type for a n-type transistor or p-type for a p-type transistor.

In one embodiment, the transistor well is opposite polarity type to the control well. For example, a second polarity type transistor well is provided for a first polarity type control well. The first polarity type may be n-type and the second polarity type may be p-type. Other configurations of transistor and control wells may also be useful. For example, the first polarity type may be p-type and the second polarity type may be n-type.

An isolation well 208 may be provided in the substrate 201. The isolation well 208 serves to isolate the first and second wells 250 and 507 from the substrate 201 to improve noise immunity of the memory device. In one embodiment, a HV well region 210 may be provided within the isolation well 208 in the substrate. In one embodiment, the HV well region encompasses the first and second wells 250 and 507. For example, the HV well region separates the control and transistor wells from the isolation well 208. The HV well region serves to improve isolation of the control well during device or programming operations. Providing a HV well region enables selective programming and reduces cell size layout. The isolation well and HV well region are the same as that described in FIGS. 1 and 2*a*-2*d*.

A cell isolation region 280, as shown, separates the first and second wells as well as other device regions. In one embodiment, the cell isolation region 280 sufficiently overlaps the first and second wells 250 and 507 to isolate the different wells. For example, the cell isolation region overlaps a portion of the first and second wells. In one embodiment, the cell isolation region defines the active transistor region 222 in the second well 507 and the active control capacitor region 220 in the first well 250.

In one embodiment, the cell isolation region 280 traverses the second well and separates the transistor S/D regions 212, 214, 234 and 532 from the erase S/D region 572 in the second well. For example, the transistor well extends beyond the access and storage transistors 110 and 130 to accommodate the erase capacitor 470. In one embodiment, the cell isolation region defines the active erase capacitor region 524 as well as the active transistor region 222 in the second well 507. For example, the cell isolation region sufficiently separates the active transistor and capacitor regions to isolate the different active regions. Other configurations of cell isolation regions and transistor well may also be useful. For example, a third (or dedicated) well may be provided to accommodate the erase capacitor. In the case where a third well is provided, the cell isolation region sufficiently separates the first, second and third wells to isolate the different wells. The cell isolation region is, for example, a shallow trench isolation (STI) region. Other types of isolation regions may also be useful.

The active erase capacitor region includes an erase S/D region 572 disposed in the second well. In one embodiment, the erase S/D region is adjacent to a side of the erase gate. For example, the erase S/D region is adjacent to a first side of the erase gate while a second side of the erase gate is devoid of a S/D region. The erase S/D region is, for example, an asymmetrical S/D region. Positioning the erase S/D region adjacent to the second side of the erase gate may also be useful. For example, the asymmetrical S/D region may be disposed adjacent to first or second side of the erase gate.

In one embodiment, the erase S/D region includes erase type dopants. In one embodiment, the erase S/D region 572 is of opposite polarity type to that of the transistor well. For example, a first polarity type erase S/D region is provided for a second polarity type transistor well. The first polarity type may be n-type and the second polarity type may be p-type. Other configurations of transistor well and erase S/D region may also be useful. For example, the first polarity type may be p-type and the second polarity type may be n-type. Providing a first polarity type erase S/D region in a second polarity type transistor well minimizes coupling between the erase gate and erase terminal.

Access and storage transistors are disposed on the active transistor region in the second or transistor well. A transistor includes a gate disposed between first and second S/D regions. The gate is disposed on the substrate while the S/D regions are disposed adjacent to the gate in the active transistor region of the substrate. A gate includes a gate electrode 228 and a gate dielectric 226. The gate electrode 228, for example, may be a polysilicon gate electrode and the gate dielectric 226 may be a silicon oxide gate dielectric. Other types of gate electrode or dielectric materials may also be useful.

Dielectric spacers (not shown) may be provided on the gate sidewalls of the transistors and capacitors. The spacers may be used to facilitate forming self-aligned S/D regions. For example, spacers are formed after forming S/D extension regions. After forming the spacers, an implant is performed to form S/D regions.

In one embodiment, the transistor S/D regions 212, 214, 234 and 532 are self-aligned S/D regions. In one embodiment, the first and second access S/D regions 212 and 214 are self-aligned to first and second sides of the access gate and first and second storage S/D regions 234 and 532 are self-aligned to first and second sides of the storage gate. For example, the self-aligned S/D regions are aligned to sidewall spacers of the transistor gates 110 and 130. Other configurations of S/D regions may also be useful. In one embodiment, the erase S/D region 572 is a non-self-aligned S/D region. In one embodiment, the erase S/D region is displaced away from the first side of the erase gate, as shown in FIGS. 5b-5d. For example, the non-self-aligned S/D region is displaced from sidewall spacers of the erase gate 576. For example, the erase (or non-self-aligned) S/D region may be displaced about 0.2 μm from the erase gate sidewall spacer. Other displacement distances of the non-self-aligned S/D region may also be useful. The displacement distance may be varied depending on the process overlay control, desired junction BV and/or cell read current requirement.

A S/D region, in one embodiment, may include S/D extension regions which extend beyond the S/D region. The S/D extension regions include, for example, halo and LDD regions. The halo region is a lightly doped region with second polarity type dopants. As for the LDD region, it is a lightly doped region with first polarity type dopants. For example, the halo region includes p-type dopants for a n-type transistor while the LDD region includes n-type dopants for n-type transistors.

The LDD region extends beyond the halo region. As shown in FIG. 5b, the LDD region 242 extends beyond the erase (or non-self-aligned) S/D region 572 and underlaps a portion of the erase gate. In one embodiment, the S/D extension regions have a depth less than the S/D region. The depth of the S/D region is, for example, about 0.1 μm. In one embodiment, the LDD region has a depth shallower than the halo region. For example, the LDD region overlaps the halo region. The depth of the LDD region is, for example, about 0.05 μm. Other suitable depth dimensions for the S/D region and S/D extension regions may also be useful. The depth dimensions may be varied depending on the technology node and device operating voltages. Other configurations of S/D extension regions may also be useful.

In another embodiment, a LDD region without halo region is provided. For example, a S/D extension region includes only a LDD region 242 without halo region, as shown in FIG. 5c. In one embodiment, the LDD region without halo region includes a graded LDD region.

In yet another embodiment, a deeply doped LDD region is provided. For example, a S/D extension region without halo region may include a deep LDD region 246. In the case of a deep LDD region, the depth of the LDD region may be deeper than the S/D region. As shown in FIG. 5d, a deep LDD region 246 encompasses the S/D region. For example, the depth of the S/D region may be about 0.1 μm and the depth of the deep LDD region 246 may be about 0.1-0.3 μm. Other suitable depth dimensions may also be useful. In one embodiment, the deep LDD region without halo region includes a highly graded LDD region.

Although, S/D extension regions of self-aligned S/D regions (i.e. S/D regions 212, 214, 234 and 532) are not shown, it is to be understood that the S/D extension regions as illustrated in FIGS. 5b-5d are also provided for these self-aligned S/D regions. For example, the transistor S/D regions 212, 214, 234 and 532 and erase S/D region 572 include similar configurations of S/D extension regions.

The control capacitor 150 is disposed on the first well 250. The control capacitor includes a control gate 256 disposed on the substrate over the active capacitor region 220. The control gate includes a control gate electrode 228 over a control gate dielectric 226. The control gate electrode 228, for example, may be a polysilicon control gate electrode and the control gate dielectric 226 may be silicon oxide control gate dielectric. Other types of gate electrode or dielectric materials may also be useful. The control gate electrode, in one embodiment, is doped with control type dopants. For example, the control gate electrode is heavily doped with same polarity type dopants as the control well.

At least one control contact region 252 is disposed in the active capacitor region. For illustration purpose, two control contact regions are formed adjacent to the sides of the control gate. Other suitable number of control contact region may also be useful, depending on the desired cell size. In one embodiment, the control contact region is disposed adjacent to the control gate without underlapping the control gate. For example, the control contact region may be positioned away from the gate sidewalls and self-aligned with sidewall spacers on the sides of the control gate. Other configurations of the control contact region may also be useful. For example, the control contact region may be aligned to the sidewalls of the control gate.

The control contact region serves as a contact region to provide biasing for the control well. The control contact region, for example, improves the conductive connection between a conductive contact plug or well tap (not shown) and the control well. The control well serves as the second (or well) capacitor plate while the control gate electrode 228 serves as the first (or gate) capacitor plate. In one embodiment, the control gate electrode is doped before forming the control contact region. For example, a gate electrode layer deposited on the substrate is pre-doped with control type dopants and patterned to form the control gate electrode.

In one embodiment, the erase gate, control gate and storage gate electrodes 228 are commonly coupled. In one embodiment, the erase gate 576, control gate 256 and storage gate 236 are formed of the same gate layers. For example, patterning the gate layers create the erase, control and storage gates. In such cases, the erase, control and storage gates are formed of the same material. For example, the gate electrode and dielectric layers of the erase and control gates are formed of the same material and thickness as the storage gate electrode and dielectric layers. In one embodiment, the same gate dielectric layer used for the storage, erase and control gates includes a thickness suitable for MV devices. The gate electrodes are, for example, doped with control type dopants. Providing erase, control and storage gate electrodes doped with different dopant types may also be useful. In one embodiment, the access gate and floating gate are formed from the same gate layers. For example, the access gate is formed from the same gate layers as the erase, control and storage gates. Other configurations of the gates may also be useful. For example, the gates may be formed from different gate layers.

Metal silicide contacts (not shown) may be provided on contact regions of the memory cell. In one embodiment, metal silicide contacts are provided on the transistor S/D regions, active erase and control capacitor regions and the access gate. A silicide block 261 is disposed over the erase, storage and control gates. As shown, the silicide block wraps around the sides of the gates and extends over the substrate to overlap a portion of the storage S/D regions 234 and 532, the control contact regions 252 and the erase S/D region 572. For example, the silicide block wraps around sidewall spacers of the gates and overlaps the S/D extension region 242 of the erase S/D region. Providing a silicide block over the erase, storage and control gates prevents formation of silicide contacts over these gates. This improves data retention.

The various conductive lines of the memory cell may be disposed in metal levels (M) of the device. Conductive lines disposed in the same direction may be provided in the same metal level. For example, conductive lines disposed along the BL direction may be disposed in metal level Mx while conductive lines disposed along the WL direction may be disposed in $M_{x+1}$ of the device. Other configurations of conductive lines and metal levels may also be useful.

Figure 6A:
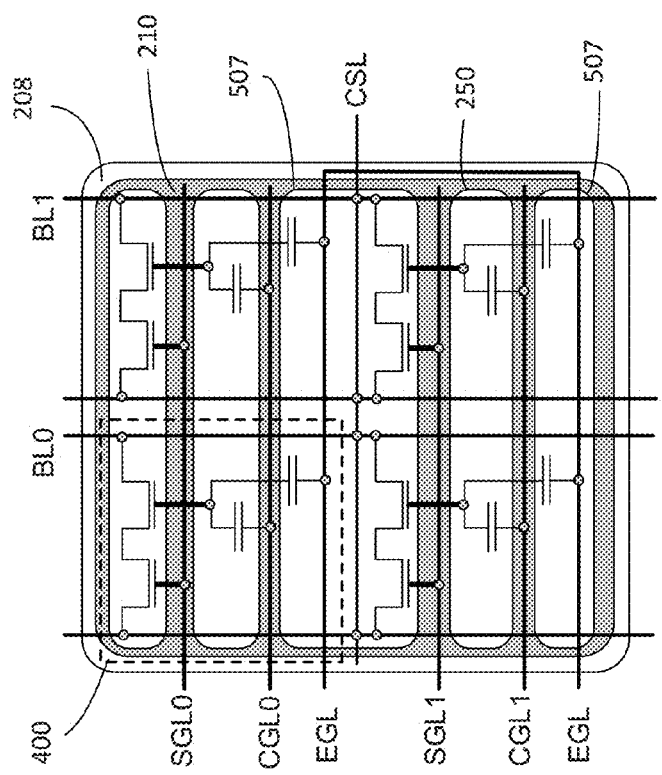
FIGS. 6a-6b show schematic diagrams of embodiments of an array of memory cells.
Figure 6B:
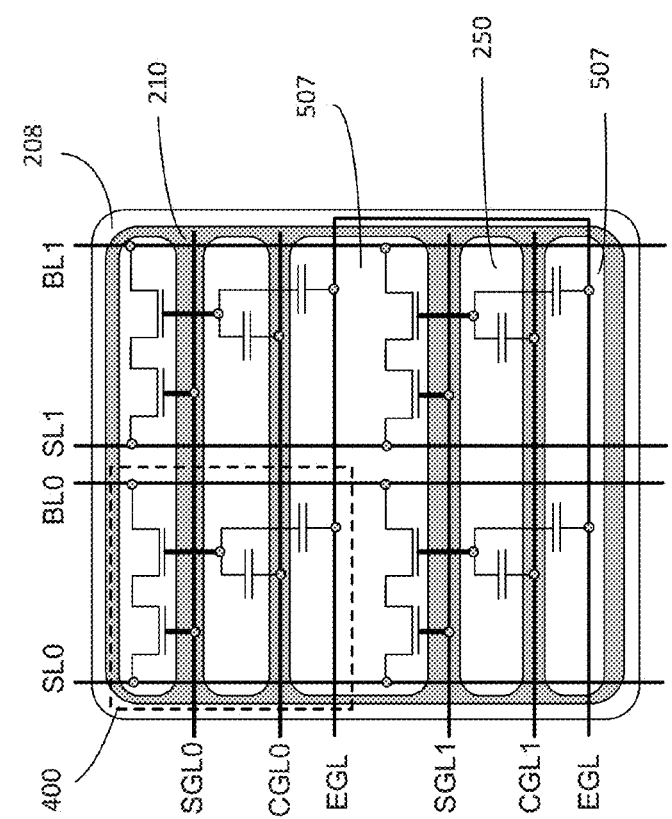

FIGS. 6a-6b show schematic diagrams of embodiments of an array 600 of memory cells. A portion of the array is shown with, for example, four memory cells 400, such as those described in FIGS. 4 and 5a-5d. Common elements may not be described or described in detail. The array of memory cells may be formed on a substrate having first and second wells 250 and 507 disposed within a HV well region 210. The HV well region is, in some embodiments, surrounded by an isolation well 208 which is common to memory arrays of a memory chip. In one embodiment, the first and second wells extend across multiple columns of interconnected memory cells of an array. The first and second wells, for example, form common first and second wells of a memory array. Other configurations of first and second wells may also be useful.

As shown in FIG. 6a, the memory cells are interconnected to form two columns connected by BLs (BL0 and BL1) and SLs (SL0 and SL1) and two rows of memory cells connected by SGLs (SGL0 and SGL1), CGLs (CGL0 and CGL1) and a common EGL. In one embodiment, the SLs (SL0 and SL1) of each column of memory cells are coupled to separate source terminals. For example, SL0 and SL1 are coupled to first and second source terminals and BL0 and BL1 are coupled to first and second drain terminals. Coupling separate columns of memory cells to separate (or dedicated) source terminals form an AND-type array configuration. For example, the AND-type array configuration illustrated has access and storage transistors of each column coupled to separate SL and BL terminals respectively. Having an AND-type array configuration provides more reliable memory cell operation within an array.

In another embodiment, the SLs of each column of memory cells are coupled to a common source terminal. As shown in FIG. 6b, the SLs of each column of memory cells may be coupled to a common source line (CSL) disposed in a WL direction. Coupling separate columns of memory cells to a common source terminal forms a NOR-type array configuration. The NOR-type configuration illustrated has access transistors in separate columns coupled to a CSL while the storage transistors in separate columns are coupled to separate drain terminals. Having a NOR-type array configuration provides random access to the memory cell and reduces footprint of an array. Other configurations of an array may also be useful.

Although a 2×2 portion of an array is shown, it is understood that the array may include numerous rows and columns. For example, the memory array may form a memory block.

The memory cell of FIGS. 4 and 5a-5d, in one embodiment, is configured to include first type transistors and first type capacitors. For example, the access and storage transistors are same polarity type to that of the control and erase capacitors. In one embodiment, the first type is n-type. For example, the memory cell is configured with n-type transistors and n-type capacitors. In such cases, the transistor (or second) well 507 and capacitor (or first) well 250 include opposite polarity type dopants. The transistor well includes second polarity type or p-type dopants while the control well includes first polarity type or n-type dopants. The transistor and erase S/D regions and control contact regions are n-type. Other configurations of the memory cell may also be useful. For example, the first polarity type may be p-type and the second polarity type may be n-type. Furthermore, the gate electrodes are doped with control type dopants. For example, the gate electrodes are doped with first polarity type or n-type dopants. Other gate configurations may also be useful.

In one embodiment, a memory cell with first type transistors and first type capacitors may include various operating modes. The first type is, for example, n-type. The memory cell includes erase and control capacitors commonly coupled to a storage gate. Table 2 below shows various biasing voltages at various terminals of a memory cell for program, erase and read operating modes:

TABLE 2

| Modes | Signals | | | | | | | | | |
|---|---|---|---|---|---|---|---|---|---|---|
| | CGL | | EGL | | BL | | SL | | SG | |
| | sel | unsel | sel | unsel | sel | unsel | sel | unsel | sel | unsel |
| PGM: FN (bit) | 18.5 | 0 V | 0 V | 0 V | 0 V | $V_{dd}$ | 0 V | $V_{dd}$ | $V_{dd}$ | $V_{dd}$ |
| ERS: FN (block or column) | 0 V | 0 V | 12.5 V | 12.5 V | 0 V | 0 V | 0 V | 0 V | 0 V | 0 V |
| Read | 3 V | 0 V | 0 | 0 | 1 V | 0 V | 0 V | 0 V | $V_{dd}$ | 0 V |

The values in Table 2 are exemplary using, for example, Fowler-Nordheim (FN) tunneling for program and erase operations. For example, the values are for an operating voltage $V_{dd}$ equal to about 5V. Other suitable voltage values may also be useful.

The memory cell may operate in a Fowler-Nordheim (FN) tunneling program mode. To effect a FN tunneling program operation, the various select (sel) signals for such a program operation are provided at the various terminals of the selected memory cell. In the program mode, electron carriers tunnel through from the transistor well to the floating gate (FG). Other suitable types of programming modes, such as channel hot electron (CHE) injection programming mode, may also be useful. In the CHE programming mode, for example, electron carriers are injected from the transistor channel to the FG on the drain side.

The memory cell may operate in FN tunneling erase mode. To effect a FN tunneling erase mode, the various sel signals for such an erase operation are provided at the various terminals of the selected memory cell. The memory cell includes an erase gate commonly coupled to the floating gate. In the erase mode, electron carriers move from the erase gate to the erase S/D region. The erase mode may effect a memory block or column erase operation.

As for a read operation, the various sel signals for a read operation are provided at the various terminals of the selected memory cell to effect the read operation.

The memory cell as described in FIG. 4 and FIGS. 5a-5d results in advantages. The configuration and arrangement of the memory cell as described allows erase and program operations to be performed on separate regions of the memory cell, decoupling programming and erase operations. This improves endurance of the memory cell. In addition, FN tunneling program and erase modes allow for simplified charge pump design due to small programming current. Providing the select and storage transistors as medium voltage device, such as 5V device, avoids the risk of mix and matching LV with MV gate dielectric. The use of a common gate dielectric layer having a thickness suitable for medium voltage devices for the storage, erase and control gates simplifies the manufacturing process and enhances the programming speed. Furthermore, by implementing a non-self-aligned S/D region as an erase terminal coupled to the EGL of the memory device, GIDL current is suppressed and gated BV is improved. The non-self-aligned S/D region may be provided in various configurations for further advantages, as described herein. In addition, the overall macro size of the memory device may also be reduced by using only a positive charge pump.

Figure 7:
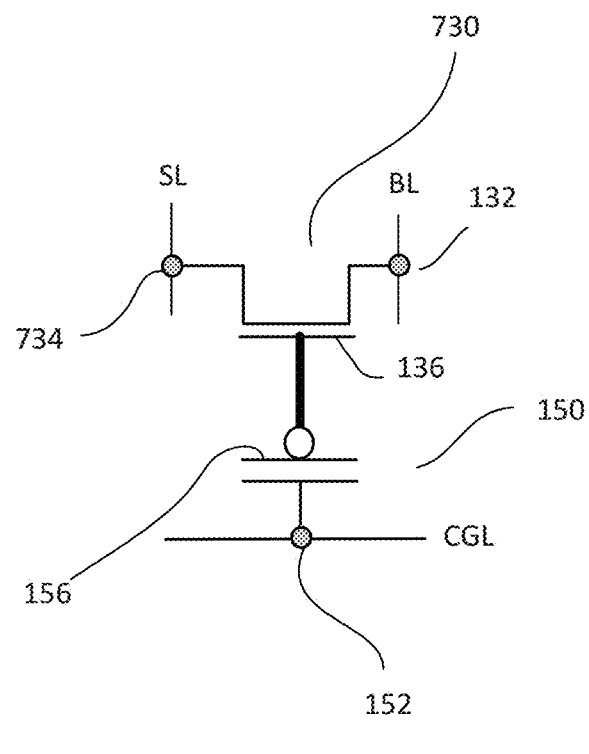
FIG. 7 shows a schematic diagram of another embodiment of a memory cell.

FIG. 7 shows a schematic diagram of yet another embodiment of a memory cell 700 of a memory device. The memory cell is similar to that described in FIGS. 1 and 4. Common elements may not be described or described in detail. The memory cell 700 shown is a non-volatile memory cell. For example, the memory cell is a non-volatile MTP memory cell.

As shown in FIG. 7, memory cell 700 includes a transistor 730 and a capacitor 150. In one embodiment, the transistor functions as a storage element and the capacitor functions as a voltage coupling element. The transistor and capacitor are, for example, a metal oxide semiconductor (MOS) transistor and a MOS capacitor. The transistor includes a gate between first and second diffusion regions. The diffusion regions of a transistor are heavily doped regions with first polarity type dopants. The polarity type determines the type of transistor. For example, the first polarity may be n-type for a n-type transistor or p-type for a p-type transistor. The diffusion regions serve as transistor source/drain (S/D) regions. The S/D regions, in one embodiment, include S/D extension regions. The S/D extension regions include, for example, halo and lightly doped drain (LDD) regions.

A gate includes a gate electrode and a gate dielectric. The transistor 730 serves as a storage transistor and the capacitor 150 serves as a control capacitor. For example, the storage transistor 730 includes a first storage S/D region 132, a second storage S/D region 734 and a storage gate 136. The storage gate 136 may be referred to as a floating gate. In one embodiment, the second storage S/D region 734 is self-aligned to the storage gate while the first storage S/D region 132 is displaced from the storage gate. For example, the first storage S/D region is a non-self-aligned S/D region. Other configurations of S/D regions may also be useful.

The control capacitor 150 includes a control gate 156 with a control gate electrode and a control gate dielectric. The control gate 156 forms the control capacitor 150. The control capacitor 150 is the same as that described in FIG. 1.

In one embodiment, a common gate conductor couples the control and storage gates. For example, the same gate layers (i.e. gate dielectric and gate electrode layers) form the control gate 156 and storage gate 136. In one embodiment, the same gate dielectric layer used for the storage and control gates includes a thickness suitable for medium voltage (MV) devices. Other suitable thickness dimensions may also be useful.

The first storage S/D region 132 is coupled to a bit line (BL) of the memory device and the second storage S/D region 734 is coupled to a source line (SL) of the memory device. The first storage S/D region may serve as a drain terminal and the second storage S/D region may serve as a source terminal of the memory device. The control contact region 152 is coupled to a control gate line (CGL) of the memory device. In one embodiment, the CGL is disposed along a first direction, such as a wordline direction, while the BL is disposed along a second direction, such as the bitline direction. The first and second directions, for example, are orthogonal to each other. As for the SL, it is disposed along the bitline direction. Other configurations of BL, CGL, and SL may also be useful.

Figure 8A:
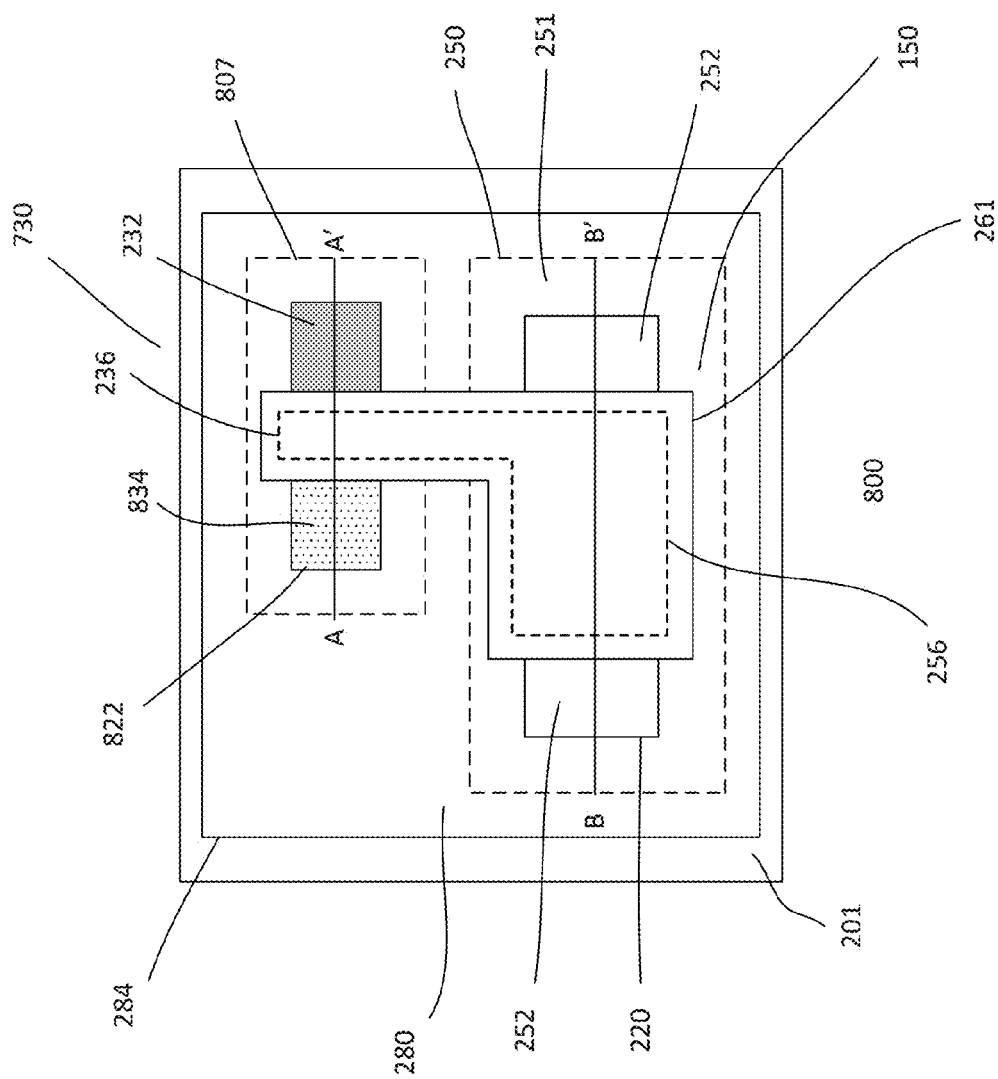
Figure 8B:
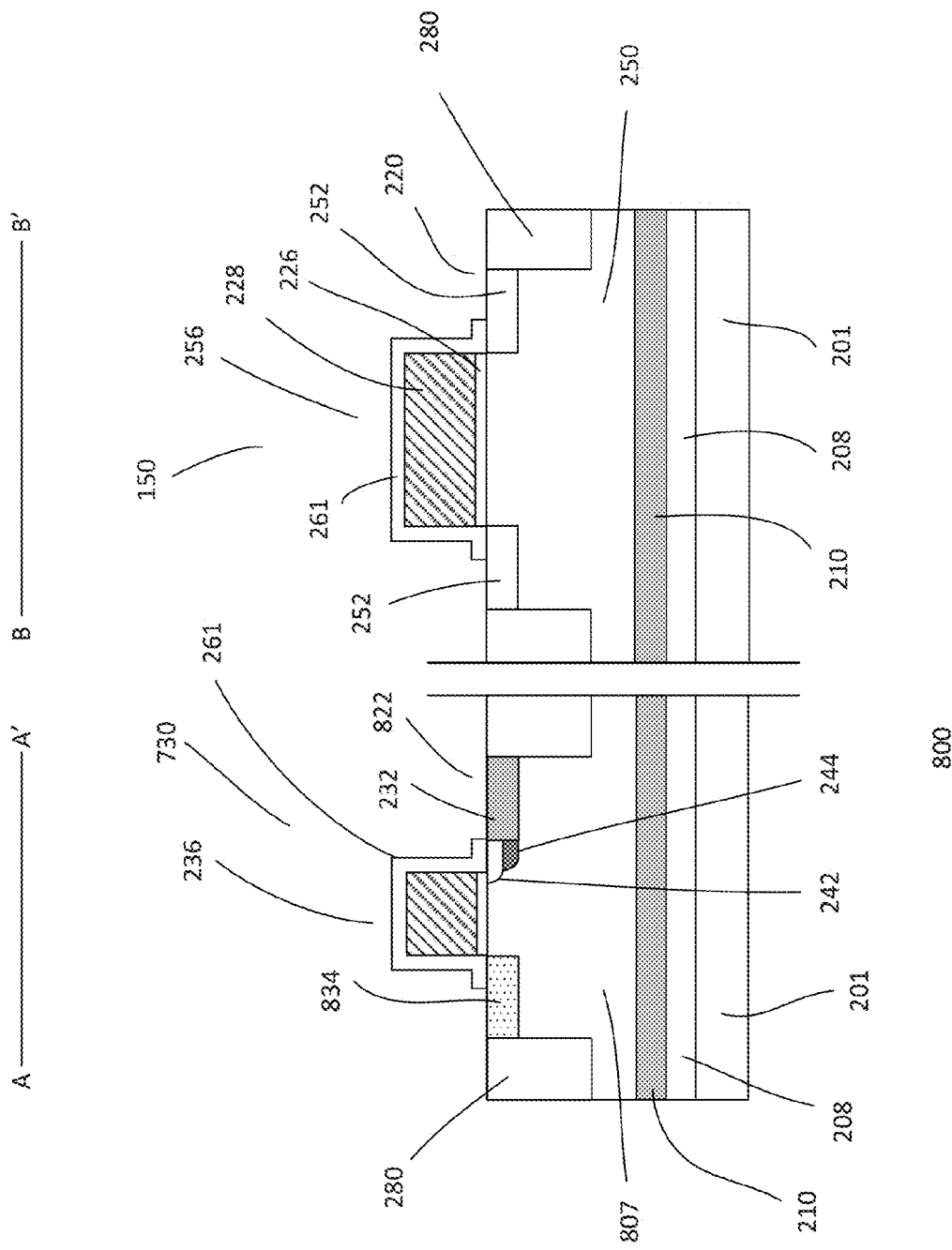
Figure 8C:
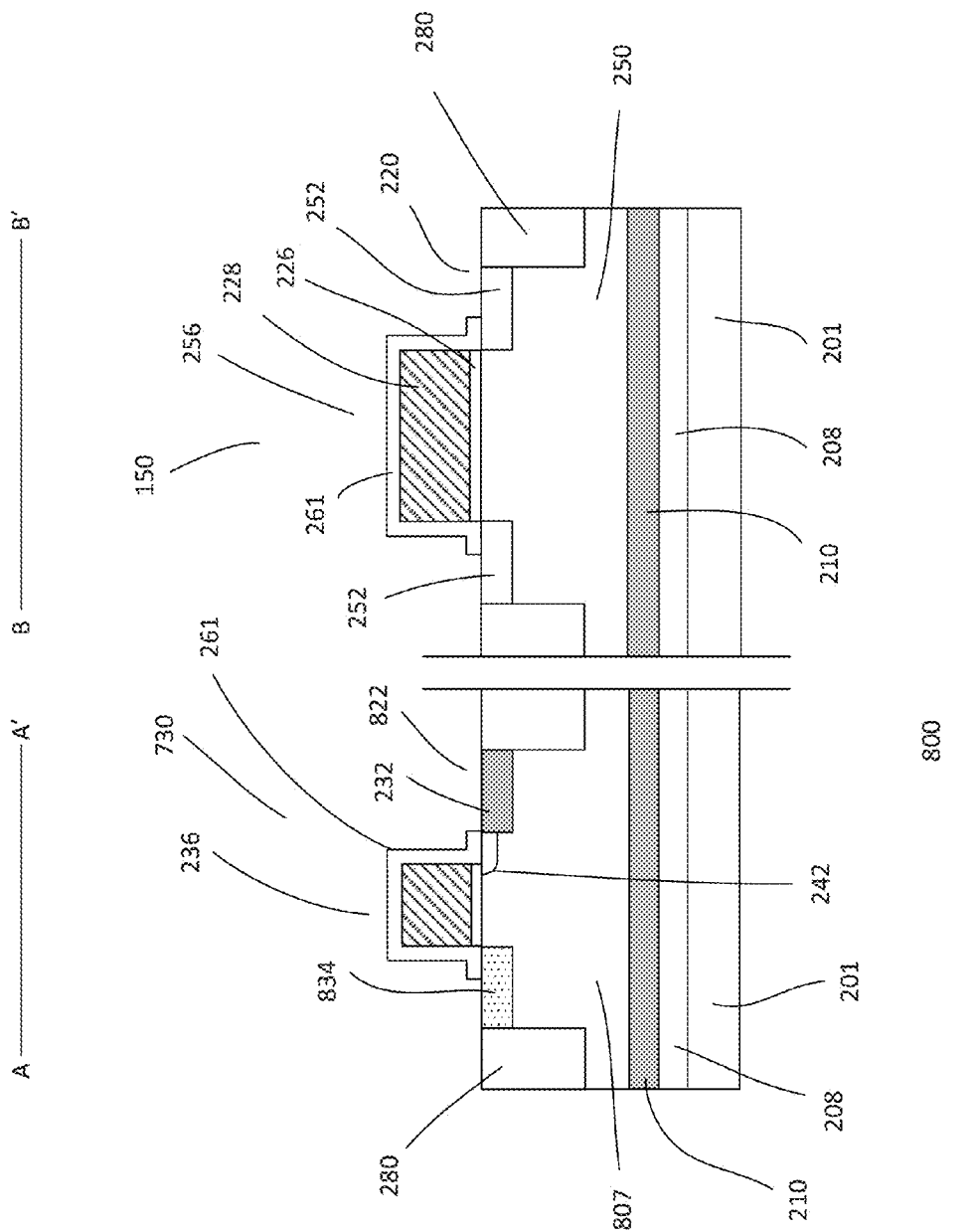

FIG. 8*a* shows a top view of various embodiments of a memory device and FIGS. 8*b*-8*d* show cross-sectional views of various embodiments of the memory device. The memory device includes a memory cell 800. The cross-sectional views are, for example, along A-A' and B-B' of the memory cell 800. The memory cell is similar to that described in FIGS. 1, 2*a*-2*d*, 4, 5*a*-5*d* and 7. Common elements may not be described or described in detail. The memory cell 800 shown is a NVM cell. For example, the memory cell is a non-volatile MTP memory cell.

The device is disposed on a substrate 201 and a cell region 284 is provided in the substrate. The cell region includes first and second wells 250 and 807 disposed adjacent to each other. The first well serves as a control well for a control gate while the second well serves as a transistor well. For example, the transistor well serves as a well for a storage transistor 730. In one embodiment, the control gate includes a control capacitor 150. The control capacitor may be MOS capacitor. Other types of control gates may also be useful.

The first well 250 accommodates the control capacitor and the second well 807 accommodates the storage transistor. The first (or control) well includes capacitor type dopants and the second (or transistor) well includes transistor well type dopants. In one embodiment, the control well is a lightly doped well. As for the transistor well, it may be a lightly to intermediately doped well. In one embodiment, the first and second wells may serve as device wells for HV and MV devices respectively. For example, the first well is sufficiently doped to form a HV device well while the second well is sufficiently doped to form a MV device well.

In one embodiment, at least one control contact region 252 which minimizes contact resistance is disposed within the first well. In one embodiment, the control well and the control contact region include capacitor type dopants. For example, the control contact region is heavily doped with capacitor type dopants. The first well serves as a control well for a control gate and the control contact region serves as a contact region to the control well and provides a biasing for the control well.

The polarity type of the control well may depend on the polarity type of the control gate. In one embodiment, the polarity of the capacitor type dopants depend on the polarity type of the control capacitor. For example, the capacitor type dopant is p-type for a p-type MOS capacitor or n-type for a n-type MOS capacitor. As for the polarity of the transistor well type dopants, it is the opposite polarity type to the transistor. In one embodiment, the transistor well dopants are second polarity type dopants for a first type transistor with first polarity type dopants. For example, the transistor well type dopants are p-type for a n-type transistor. In one embodiment, the transistor well is of opposite polarity type to the control well. For example, the transistor well dopants are second polarity type dopants for a first type control well with first polarity type dopants. The first polarity type may be n-type and the second polarity type may be p-type. Other configurations of transistor and control wells may also be useful. For example, the first polarity type may be p-type and the second polarity type may be n-type.

An isolation well 208 may be provided in the substrate 201. The isolation well 208 serves to isolate the first and second wells 250 and 807 from the substrate 201 to improve noise immunity of the memory device. In one embodiment, a HV well region 210 may be provided within the isolation well 208 in the substrate. In one embodiment, the HV well region encompasses the control and transistor wells. For example, the HV well region separates the first and second wells 250 and 807 from the isolation well 208. The HV well region serves to improve isolation of the control well during device or programming operations. Providing a HV well region enables selective programming and reduces cell size layout. The isolation well and HV well region are the same as that described in FIGS. 2*a*-2*d* and FIGS. 5*a*-5*d*.

A cell isolation region 280, as shown, separates the first and second wells as well as the other device regions. In one embodiment, the cell isolation region 280 sufficiently overlaps the first and second wells 250 and 807 to isolate the wells. The cell isolation region defines the active regions in the first and second wells. For example, the cell isolation region defines the active transistor region 822 and the active capacitor region 220. The cell isolation region is, for example, STI region. Providing other types of isolation region between the wells may also be useful.

A storage transistor is disposed on the active transistor region in the second or transistor well. The transistor includes a gate disposed between first and second storage S/D regions 232 and 834. The transistor S/D regions, for example, include dopants of the same polarity type as the transistor type. For example, p-type transistors have S/D regions with p-type dopants. The S/D regions, for example, are heavily doped regions. The gate is disposed on the substrate while the S/D regions are disposed adjacent to the gate in the active transistor region of the substrate. A gate includes a gate electrode 228 and a gate dielectric 226. The gate electrode 228, for example, may be a polysilicon gate electrode and the gate dielectric 226 may be a silicon oxide gate dielectric. Other types of gate electrode or dielectric materials may also be useful.

Dielectric spacers (not shown) may be provided on the gate sidewalls of the transistor and capacitor. The spacers may be used to facilitate forming self-aligned S/D regions. For example, spacers are formed after S/D extension regions are formed in the active transistor region. After forming the spacers, an implant is performed to form S/D regions in the active transistor region.

As discussed, the storage transistor 730 includes first and second storage S/D regions 232 and 834 heavily doped with transistor type dopants in the substrate and a storage gate 236 on the substrate. In one embodiment, the second storage S/D region 834 is self-aligned to the second side of the storage gate while the first storage S/D region 232 is displaced from the first side of the storage gate, as shown in FIGS. 8*b*-8*d*. For example, the second storage S/D region is a self-aligned S/D region while the first storage S/D region is a non-self-aligned S/D region. In one embodiment, the first storage (or non-self-aligned) S/D region 232 is displaced a distance from the gate sidewall spacer. For example, the non-self-aligned S/D region may be displaced about 0.2 μm from the storage gate sidewall spacer. Other displacement distances of the non-self-aligned S/D region may also be useful. For example, the displacement distance may be varied depending on the process overlay control, desired junction BV and/or cell read current requirement.

A transistor S/D region, in one embodiment, may include S/D extension regions which extend beyond the S/D region. The S/D extension regions include, for example, halo and LDD regions. The LDD regions may extend beyond the S/D regions to underlap a portion of the transistor gate.

In one embodiment, the S/D extension regions include a depth less than the S/D region. The depth of the S/D region is, for example, about 0.1 μm. In one embodiment, the LDD region has a depth shallower than the halo region. As shown in FIG. 8b, the LDD region 242 extends beyond the first storage (or non-self-aligned) S/D region 232 and underlaps a portion of the storage gate 236. For example, the LDD region overlaps the halo region. For example, the depth of the LDD region 242 is about 0.05 μm while the depth of the halo region 244 is about 0.05-0.1 μm. Other suitable depth dimensions for the S/D region and S/D extension regions may also be useful. For example, the depth dimensions may be varied depending on the technology node and device operating voltages. Other configurations of S/D extension regions may also be useful.

In another embodiment, a S/D extension region without halo region is provided. For example, a S/D extension region includes only a LDD region 242 without halo region, as shown in FIG. 8c. In one embodiment, the LDD region without halo region in such configuration includes a graded LDD region.

In yet another embodiment, a deeply doped S/D extension region without halo region is provided. For example, a S/D extension region without halo region may include a deep LDD region 246. In the case of a deep LDD region, the depth of the LDD region may be deeper than the S/D region. As shown in FIG. 8d, a deep LDD region 246 encompasses the first storage S/D region 232. For example, the depth of the S/D region may be about 0.1 μm and the depth of the deep LDD region 246 may be about 0.1-0.3 μm. Other suitable depth dimensions may also be useful. In one embodiment, the deep LDD region without halo region in such configuration includes a highly graded LDD region.

Although, S/D extension regions of self-aligned S/D region (i.e. S/D region 834) is not shown, it is to be understood that the S/D extension regions as illustrated in FIGS. 8b-8d are also provided for self-aligned S/D regions. For example, the transistor S/D regions 232 and 834 include similar configurations of S/D extension regions.

The control capacitor includes a control gate 256 disposed on the substrate over the active capacitor region 220. At least one control contact region 252 is disposed in the active capacitor region. For illustration purpose, two control contact regions are formed adjacent to the sides of the control gate. Other suitable number of control contact region may also be useful, depending on the desired cell size. In one embodiment, the control contact region is disposed adjacent to the control gate without underlapping the control gate. For example, the control contact region may be positioned away from the gate sidewalls and self-aligned with sidewall spacers on the sides of the control gate. Other configurations of the control contact region may also be useful. For example, the control contact region may be aligned to the sidewalls of the control gate.

In one embodiment, the control gate and storage gate electrodes 228 are commonly coupled. In one embodiment, the control gate 256 and storage gate 236 are formed of the same gate layer. For example, patterning the gate layers create the control and storage gates. In such cases, the control gate 256 and storage gate 236 are formed of the same material. For example, the control gate electrode and gate dielectric layers are formed of the same material and thickness as the storage gate electrode and gate dielectric layers. In one embodiment, the same gate dielectric layer used for the storage and control gates includes a thickness suitable for MV devices. The gate electrodes are, for example, doped with capacitor type dopants. Providing gate electrodes doped with other dopant types may also be useful. Other configurations of the gates may also be useful. For example, the gates may be formed from different gate layers.

Metal silicide contacts (not shown) may be provided on contact regions of the memory cell. In one embodiment, metal silicide contacts are provided on the transistor S/D regions and active capacitor regions. A silicide block 261 is disposed over the storage and control gates. As shown, the silicide block wraps around the sides of the gates and extends over the substrate to overlap a portion of the storage S/D regions 834 and 232 and the control contact regions 252. For example, the silicide block wraps around sidewall spacers of the gates and overlaps the S/D extension region 242 of the non-self-aligned S/D region. Providing a silicide block over the storage and control gates prevents formation of silicide contacts over these gates. This improves data retention.

The second storage S/D region 834 is coupled to a SL of the memory device. The first storage S/D region 232 is coupled to a BL of the memory device. The control contact region 252 is coupled to a CGL of the memory device. In some embodiments, the control gate 256 is implemented as a control capacitor 150 and the first or non-self-aligned storage S/D region is implemented as an erase terminal. In one embodiment, the CGL is disposed along a first direction, such as a wordline direction, while the SL and BL are disposed along a second direction, such as the bitline direction which is perpendicular to the WL direction. Other configurations of BL, CGL and SL may also be useful.

The various conductive lines of the memory cell may be disposed in metal levels (M) of the device. Conductive lines disposed in the same direction may be provided in the same metal level. For example, conductive lines disposed along the BL direction may be disposed in metal level $M_X$ while conductive lines disposed along the WL direction may be disposed in $M_{X+1}$ of the device. Other configurations of conductive lines and metal levels may also be useful.

Figure 9:
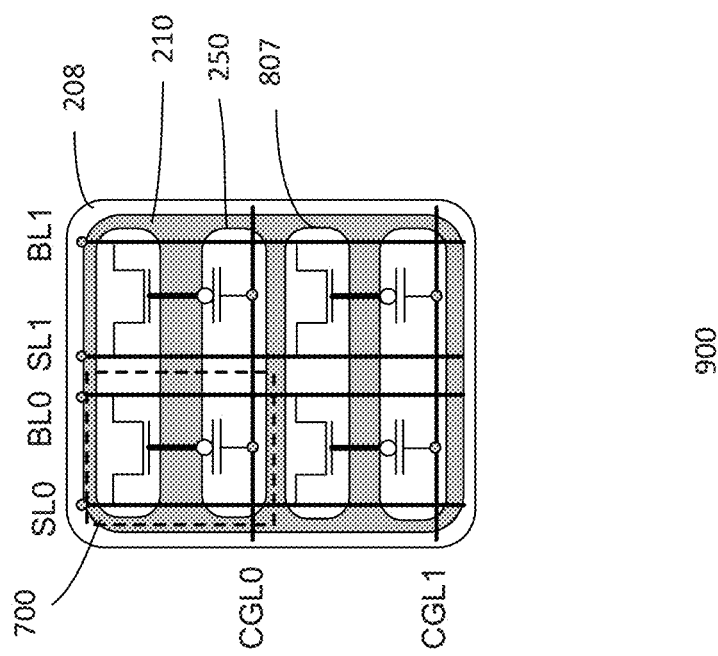
FIG. 9 shows a schematic diagram of an embodiment of an array of memory cells.

FIG. 9 shows a schematic diagram of an embodiment of an array 900 of memory cells. A portion of the array is shown with, for example, four memory cells 700, such as those described in FIGS. 7 and 8a-8d. Common elements may not be described or described in detail. The array of memory cells may be formed on a substrate having first and second wells 250 and 807. In one embodiment, the first and second wells extend across multiple columns of interconnected memory cells of an array. The first and second wells, for example, form common first and second wells of a memory array. Other configurations of first and second wells may also be useful.

A HV well region 210 encompasses the first and second wells 250 and 807. In one embodiment, the HV well region 210 is a common HV well region of a memory array. The HV well region, for example, encompasses a plurality of memory cells of an array. The HV well region is, in some embodiments, surrounded by an isolation well 208. In one embodiment, the isolation well is a common isolation well of a memory chip. The isolation well, for example, encompasses a plurality of memory arrays of a memory chip.

As shown in FIG. 9, the memory cells are interconnected to form two columns connected by BLs (BL0 and BL1) and SLs (SL0 and SL1) and two rows of memory cells connected by CGLs (CGL0 and CGL1). In one embodiment, the SLs (SL0 and SL1) of each column of memory cells are coupled to separate source terminals. For example, SL0 and SL1 are coupled to first and second source terminals and BL0 and BL1 are coupled to first and second drain terminals. In one embodiment, erase operations are performed at the drain terminal or non-self-aligned S/D region of the memory cells. For example, the non-self-aligned S/D regions or drain terminals serve as erase terminals.

Although a 2×2 portion of an array is shown, it is understood that the array may include numerous rows and columns.

The memory cell of FIGS. 7 and 8*a*-8*d*, in one embodiment, is configured to include a first type transistor and a first type capacitor. For example, the storage transistor is same polarity type to that of the control capacitor. In one embodiment, the first type is n-type. For example, the memory cell is configured with a n-type transistor and a n-type capacitor. In such cases, the transistor (or second) well 807 and capacitor (or first) well 250 include opposite polarity type dopants. The transistor well includes second polarity type or p-type dopants while the control well includes first polarity type or n-type dopants. The transistor S/D regions and capacitor contact regions are n-type. Furthermore, the gate electrodes are doped with capacitor type dopants. For example, the gate electrodes are doped with first polarity type or n-type dopants. Other configurations of the memory cell may also be useful. For example, the memory cell may be configured to include a first type control capacitor while the transistor may be a second type transistor different from the capacitor.

In one embodiment, a memory cell with a first type transistor and a first type capacitor may include various operating modes. The first type is, for example, n-type. The memory cell includes a control capacitor coupled to a storage gate. Table 3 below shows various biasing voltages at various terminals of a memory cell for program, erase and read operating modes:

TABLE 3

| | Signals | | | | | |
|---|---|---|---|---|---|---|
| | CGL | | BL | | SL | |
| Modes | sel | unsel | sel | unsel | sel | unsel |
| PGM: FN (bit) | 18.5 V | 0 V | 0 V | $V_{dd}$ | 0 V | $V_{dd}$ |
| ERS: FN (block or column) | 0 V | 0 V | 12.5 V | 12.5 V | 0 V | 0 V |
| Read | 3 V | 0 V | 1 V | 0 V | 0 V | 0 V |

The values in Table 3 are exemplary using Fowler-Nordheim (FN) tunneling for program and erase operations. For example, the values are for an operating voltage $V_{dd}$ equal to about 5V. Other suitable voltage values may also be useful.

The memory cell may operate in a Fowler-Nordheim (FN) tunneling program mode. To effect a FN tunneling program operation, the various select (sel) signals for such a program operation are provided at the various terminals of the selected memory cell. In the program mode, electron carriers tunnel through from the transistor well to the floating gate (FG). Other suitable types of programming modes, such as channel hot electron (CHE) injection programming mode, may also be useful. In the CHE programming mode, for example, electron carriers are injected from the transistor channel to the FG on the drain side.

The memory cell may operate in FN tunneling erase mode. To effect a FN tunneling erase mode, the various sel signals for such an erase operation are provided at the various terminals of the selected memory cell. In the erase mode, electron carriers move from the FG to the transistor well from the drain side of the gate. The erase mode may effect a memory block or column erase operation.

As for a read operation, various select (sel) signals for a read operation are provided at the various terminals of the selected memory cell to effect the read operation.

The memory cell as described in FIG. 7 and FIGS. 8*a*-8*d* include the same or similar advantages as that described in FIGS. 1, 2*a*-2*d*, 4 and 5*a*-5*d*. The configuration and arrangement of the memory cell as described couples a non-self-aligned S/D region to the BL of the memory device. The non-self-aligned S/D region serves as a drain or erase terminal of the memory cell. This configuration of drain or erase terminal suppresses GIDL current and improves gated BV. Thus, a higher erase voltage is allowed. Furthermore, the memory cell as described in FIGS. 7 and 8*a*-8*d* is devoid of an access transistor. This further reduces the overall cell size of the memory device, allowing a more compact device to be formed.

Figure 10:
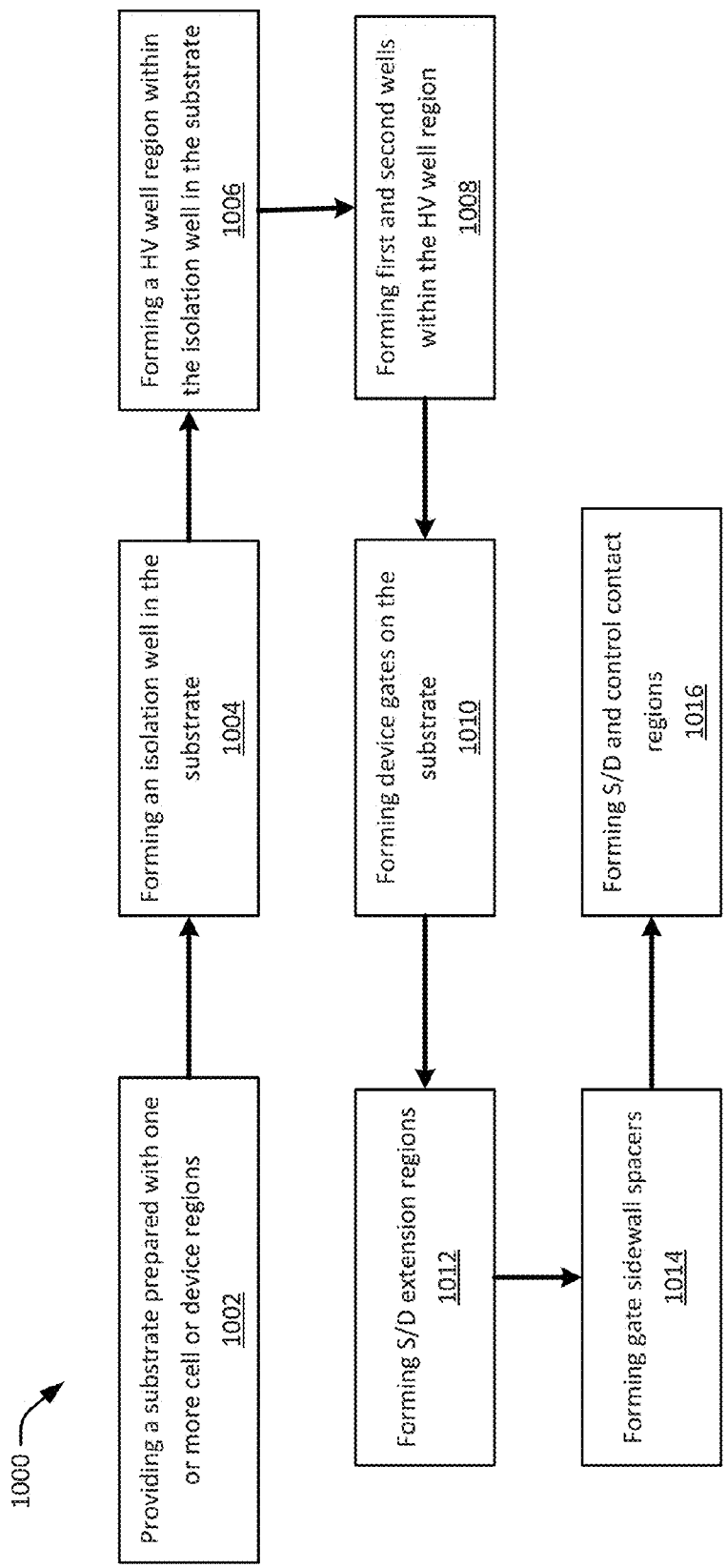
FIG. 10 shows a process for forming embodiments of the memory cell.

FIG. 10 shows a process 1000 for forming embodiments of the memory cell described herein. In particular, process 1000 illustrates an exemplary semiconductor manufacturing process flow to form a memory cell described in FIGS. 1, 2*a*-2*d*, 4, 5*a*-5*d*, 7 and 8*a*-8*d*. Common elements may not be described or described in detail.

At 1002, the process of forming the device includes providing a substrate prepared with one or more cell or device regions. The substrate is, for example, lightly doped with second polarity type dopants, such as p-type dopants. Providing a substrate doped with other types of dopants or undoped substrate may also be useful. A device region is isolated from another device region by device isolation regions, such as shallow trench isolation (STI) regions. In one embodiment, the device isolation regions define active regions, such as active transistor and capacitor regions. For example, device isolation regions isolate the transistor and capacitor regions and other device regions, such as HV, MV and/or LV devices. In one embodiment, forming the device isolation region includes forming a trench in the substrate and forming an insulation layer which fills the trench. A planarization process is performed to form a planar STI region.

At 1004, an isolation well is formed in the substrate. In one embodiment, the isolation well is a common isolation well encompassing memory arrays of a memory chip. The isolation well is, for example, a deep isolation well implanted to a depth below the device isolation regions. Other methods of forming the isolation well may also be useful. In one embodiment, a first polarity type isolation well is formed for a second polarity type substrate. For example, the isolation well is lightly doped with n-type dopants for a p-type substrate. Other dopant concentrations and dopant types may also be useful.

At 1006, a HV well region is formed within the isolation well in the substrate. For example, the isolation well encompasses the HV well region. In one embodiment, the HV well region is a common HV well region encompassing an array of interconnected memory cells. The HV well region is, for example, implanted to a depth shallower than the isolation well but deeper than the device isolation regions. Other techniques for forming the HV well region may also be useful. In one embodiment, a second polarity type HV well region is formed for a first polarity type isolation well. For example, the HV well region is lightly doped with p-type dopants for a n-type isolation well. Other dopant concentrations may also be useful. Other configurations of HV well region and isolation well may also be useful.

At 1008, first and second wells are formed within the HV well region. For example, the HV well region encompasses the first and second wells. The first well is formed in the active capacitor region and the second well is formed in the active transistor region. The first and second wells are, in one embodiment, implanted to a depth shallower than the HV well region but deeper than the device isolation regions. The first and second wells have, for example, about equal depths. Providing first and second wells having different depths may also be useful. Other techniques for forming the wells may also be useful. The first well is lightly doped with control or capacitor type dopants and the second well is lightly to intermediately doped with transistor type dopants. For example, the first well functions as a HV device well and the second well functions as a MV device well. Other dopant concentrations may also be useful.

At 1010, device gates are formed on the substrate. A gate dielectric layer is deposited on the substrate and across the device regions to form gate dielectrics of the various devices. For example, a silicon oxide layer is formed on the substrate to form gate dielectric layer. The gate dielectrics may be defined with different thicknesses for different device regions. In one embodiment, a gate electrode layer, such as a polysilicon layer, is deposited on the gate dielectric layer and patterned to form gate electrodes of the various devices. The patterning process also defines the capacitor(s) and transistor(s) of the memory cell. In one embodiment, the gate electrode layer is a doped polysilicon layer. For example, a gate electrode of a control gate is pre-doped with control or capacitor type dopants to form the control gate. The gate electrode and gate dielectrics are patterned to form gates of devices, such as HV, MV and/or LV and memory devices.

Figure 11A:
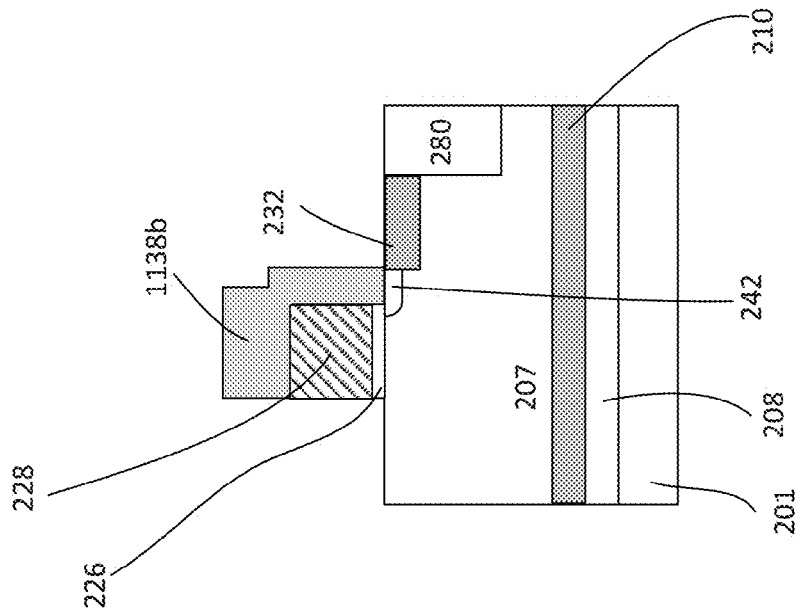
FIG. 11a shows an embodiment of a process for forming LDD region without halo region and FIG. 11b shows an embodiment of a process for forming non-self-aligned S/D region.

At 1012, S/D extension regions are formed. For example, S/D extension regions are formed in substrate regions where S/D regions will be subsequently formed. In one embodiment, LDD and halo regions are formed adjacent to transistor gates. In another embodiment, LDD and halo regions are formed adjacent to transistor and erase capacitor gates. For example, LDD and halo regions are formed adjacent to the sides of the device gates and may extend or underlap the gates. A common implant mask is employed, for example, to form the LDD and halo regions. For example, the implant mask is used to form halo regions in a first angled implant step and a second angled implant step is performed to form the LDD regions into the halo regions to form halo and LDD regions of the transistors. Other suitable techniques may also be used to form the halo and LDD regions. Providing LDD regions without halo regions may also be useful. In one embodiment, the LDD regions without halo regions may be formed by having an implant mask 1138a covers a portion of the exposed substrate region between the device gate and device isolation region as shown in FIG. 11a. For example, the implant mask exposes a portion of the substrate regions adjacent to the gate. For example, an implant mask having a thickness of about 0.6 µm is disposed at least about 0.35 µm from the sides of the device gate for a 30° angled implant. Generally, for an implant mask thickness of about 0.6 µm, a halo implant with a 30° tilt will be blocked if the distance between the implant mask and device gate is less than about 0.35 µm. Other suitable implant configurations may also be used to form LDD regions without halo region.

At 1014, gate sidewall spacers are formed. A dielectric spacer layer may be deposited on the substrate and over the device regions. The dielectric spacer layer is patterned to form gate sidewall spacers. The sidewall spacers, for example, overlap the LDD and halo regions.

Figure 11B:
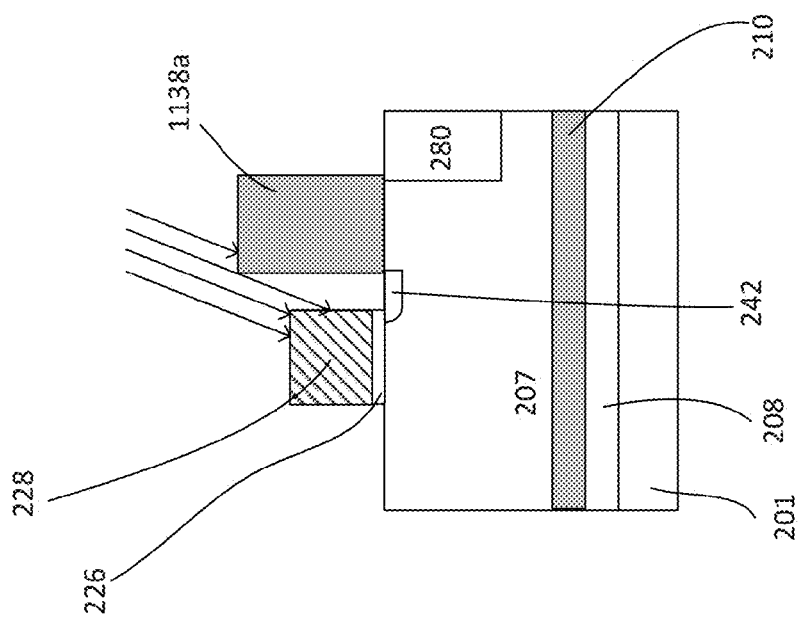

At 1016, S/D regions and capacitor contact regions are formed. For example, heavily doped regions implanted into the S/D extension regions form S/D regions while heavily doped regions implanted into a control well form control contact regions. In one embodiment, the exposed active transistor regions adjacent to the sidewall spacers are heavily doped with transistor type dopants to form transistor S/D regions. The S/D regions are, for example, implanted to a depth of about 0.1 µm and aligned to about the gate sidewall spacers. Other depth dimensions may also be useful. Forming the S/D regions includes forming self-aligned and non-self-aligned S/D regions. In one embodiment, gate sidewall spacers serve as implant masks to align S/D regions and contact regions to the spacers. For example, self-aligned S/D regions are aligned to gate sidewall spacers. In one embodiment, a common implant mask is employed to form the non-self-aligned S/D region. For example, to form the non-self-aligned S/D region, the common implant mask 1138b extends beyond the gate sidewall spacers (not shown) to cover a portion of the substrate directly adjacent to the gate sidewall spacers as shown in FIG. 11b. In one embodiment, the exposed substrate portion is implanted with transistor type dopants to form the non-self-aligned S/D region. For example, the non-self-aligned S/D region is displaced away from the gate sidewall spacer. Other suitable techniques may also be employed to form the non-self-aligned S/D region.

In one embodiment, the memory cell includes an erase capacitor. For example, forming the transistor S/D regions also forms an erase S/D region. The erase and transistor S/D regions are, for example, same polarity type. Other suitable methods to form the contact regions and S/D regions may also be useful.

The process continues to complete forming the device. The processing may include silicide block deposition and patterning to form a silicide block over the storage transistor and capacitor gates, forming metal silicide contacts to exposed terminals of the memory cell, forming an interlayer dielectric (ILD) layer, conductive contacts as well as one or more interconnect levels, final passivation, dicing, assembly and packaging. Other processes to complete forming the device may also be included. Other suitable process to form the device may also be useful.

The inventive concept of the present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A non-volatile (NV) multi-time programmable (MTP) memory cell comprising:
   a substrate;
   a floating gate disposed over a transistor well;
   a control gate disposed over a control well, wherein the control gate is coupled to the floating gate, the control gate comprises a control capacitor;

a high voltage (HV) well region disposed within the substrate, wherein the HV well region encompasses the transistor well and control well; and a non-self-aligned source/drain (S/D) region disposed within the transistor well, wherein the non-self-aligned S/D region serves as an erase terminal.

2. The memory cell of claim 1 comprising at least one control contact region disposed within the control well, wherein the control well and control contact region comprise first polarity type dopants and the transistor well comprises second polarity type dopants different from the first polarity type dopants.

3. The memory cell of claim 2 wherein the control contact region couples the control well to a control gate line (CGL) and is biased at a bias potential during various operations of the memory cell.

4. The memory cell of claim 1 comprising an isolation well disposed in the substrate, wherein the isolation well encompasses the HV well region.

5. The memory cell of claim 4 wherein the isolation well is of a first polarity type and the HV well region is of a second polarity type opposite to the first polarity type.

6. The memory cell of claim 1 wherein the non-self-aligned S/D region comprises a S/D extension region.

7. The memory cell of claim 6 comprising a select gate, wherein the select gate and floating gate are adjacent to one another and disposed over the transistor well.

8. The memory cell of claim 7 wherein a common self-aligned S/D region is disposed between the select gate and floating gate and adjacent to a side of the gates.

9. The memory cell of claim 8 comprising first and second sidewall spacers disposed on first and second sides of the floating gate, wherein the non-self-aligned S/D region is displaced away from the first sidewall spacer on the first side of the floating gate and the common-self-aligned S/D region is self-aligned to at least the second sidewall spacer on the second side of the floating gate.

10. The memory cell of claim 8 comprising an erase gate disposed over the transistor well, wherein the erase gate is coupled to the floating gate, the erase gate comprises an erase capacitor.

11. The memory cell of claim 10 wherein the non-self-aligned S/D region is disposed adjacent to a side of the erase gate.

12. The memory cell of claim 11 wherein:
the erase gate and non-self-aligned S/D region comprise first polarity type dopants; and
the transistor well comprises second polarity type dopants different from the first polarity type dopants.

13. The memory cell of claim 1 wherein the non-self-aligned S/D region comprises a lightly doped drain (LDD) region extending beyond the non-self-aligned S/D region.

14. The memory cell of claim 13 wherein the LDD region includes a depth deeper than the non-self-aligned S/D region, wherein the LDD region encompasses the non-self-aligned S/D region.

15. A non-volatile (NV) multi-time programmable (MTP) memory cell comprising:
a substrate prepared with an isolation well;
a high voltage (HV) well region disposed within the isolation well;
first and second wells disposed within the HV well region;
a floating gate disposed over the second well;
a control gate disposed over the first well, wherein the control gate is coupled to the floating gate, the control gate comprises a control capacitor; and
a non-self-aligned source/drain (S/D) region disposed within the second well, wherein the non-self-aligned S/D region includes a S/D extension region, the non-self-aligned S/D region serves as an erase terminal.

16. The memory cell of claim 15 wherein the non-self-aligned S/D region is disposed adjacent to a first side of the floating gate.

17. The memory cell of claim 15 comprising:
a select gate, wherein the select gate and floating gate are adjacent to one another and disposed over the second well; and
an erase gate disposed over the second well, wherein the erase gate is coupled to the floating gate, the erase gate comprises an erase capacitor.

18. The memory cell of claim 17 wherein the non-self-aligned S/D region is disposed adjacent to the erase gate.

19. The memory cell of claim 15 wherein the S/D extension region encompasses the non-self-aligned S/D region, the S/D extension region comprises a lightly doped drain (LDD) region.

20. The memory cell of claim 16 comprising:
a self-aligned S/D region disposed adjacent to a second side of the floating gate; and
a silicide block disposed over at least the floating gate and the control gate, wherein the self-aligned S/D region is self-aligned to the second side of the floating gate and the non-self-aligned S/D region is not self-aligned to the first side of the floating gate and is displaced away from the first side of the floating gate by the silicide block over the floating gate.

* * * * *